United States Patent
Wada et al.

(10) Patent No.: US 7,271,475 B2
(45) Date of Patent: Sep. 18, 2007

(54) MEMORY CARD WITH CONNECTING PORTIONS FOR CONNECTION TO AN ADAPTER

(75) Inventors: Tamaki Wada, Higashimurayama (JP); Hirotaka Nishizawa, Fuchu (JP); Masachika Masuda, Tokorozawa (JP); Kenji Osawa, Hachioji (JP); Junichiro Osako, Tokorozawa (JP); Satoshi Hatakeyama, Fujisawa (JP); Haruji Ishihara, Kawaguchi (JP); Kazuo Yoshizaki, Musashimurayama (JP); Kazunori Furusawa, Musahino (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/431,074

(22) Filed: May 10, 2006

(65) Prior Publication Data
US 2006/0220204 A1 Oct. 5, 2006

Related U.S. Application Data

(60) Continuation of application No. 11/204,047, filed on Aug. 16, 2005, now Pat. No. 7,239,011, which is a continuation of application No. 10/267,784, filed on Oct. 10, 2002, now Pat. No. 7,053,471, which is a division of application No. 10/240,187, filed as application No. PCT/JP01/11640 on Dec. 28, 2001, now Pat. No. 6,858,925.

(30) Foreign Application Priority Data
Apr. 2, 2001 (JP) .............................. 2001-103535

(51) Int. Cl.
*H01L 23/02* (2006.01)
*G06F 1/16* (2006.01)
*H01R 24/00* (2006.01)

(52) U.S. Cl. .................. 257/679; 257/724; 257/787; 361/684; 361/737; 439/630

(58) Field of Classification Search ................ None
See application file for complete search history.

(56) References Cited

U.S. PATENT DOCUMENTS

| | | | |
|---|---|---|---|
| 4,532,419 A | 7/1985 | Takeda | 235/492 |
| 4,727,246 A | 2/1988 | Hara et al. | 235/488 |
| 5,272,374 A | 12/1993 | Kodai et al. | 257/679 |
| D368,082 S | 3/1996 | Goto | 14/114 |
| 5,541,452 A | 7/1996 | Onoda et al. | 257/723 |

(Continued)

FOREIGN PATENT DOCUMENTS

DE 4105869 8/1992

(Continued)

OTHER PUBLICATIONS

MMCA Technical Committee "The Multimedia Card system summary, based on system specification version 2.2" dated Jan. 2000, p. 10-p. 12; figure 5.

*Primary Examiner*—Alonzo Chambliss
(74) *Attorney, Agent, or Firm*—Miles & Stockbridge P.C.

(57) ABSTRACT

On an adapter mounting portion 3a having a projecting cross section which is formed on a cap 3 of a small-sized memory card 1, a recessed portion of an adapter 2 side is fitted so that both parts are formed as an integral unit in a replaceable manner. Accordingly, the small-sized memory card 1 can maintain the dimensional compatibility with respect to existing memory cards whereby the small-sized memory card 1 can be used also in equipment which is designed to cope with the existing memory cards.

34 Claims, 39 Drawing Sheets

U.S. PATENT DOCUMENTS

| | | | |
|---|---|---|---|
| 5,550,709 A | 8/1996 | Iwasaki | 361/684 |
| 5,612,532 A | 3/1997 | Iwasaki | 235/492 |
| 5,820,414 A | 10/1998 | Omori | 439/638 |
| 5,936,227 A | 8/1999 | Truggelmann et al. | 235/492 |
| 6,028,774 A | 2/2000 | Shin et al. | 361/764 |
| 6,040,622 A | 3/2000 | Wallace | 257/679 |
| 6,076,737 A | 6/2000 | Gogami et al. | 235/492 |
| 6,112,996 A | 9/2000 | Matsuo | 235/492 |
| 6,141,210 A | 10/2000 | Iwasaki | 361/684 |
| 6,145,023 A | 11/2000 | Iwasaki | 710/13 |
| 6,147,860 A | 11/2000 | Iwasaki | 361/684 |
| 6,147,861 A | 11/2000 | Iwasaki | 361/684 |
| 6,182,159 B1 | 1/2001 | Urabe | 710/2 |
| 6,193,163 B1 | 2/2001 | Fehrman et al. | 235/488 |
| 6,279,114 B1 | 8/2001 | Toombs et al. | 713/300 |
| 6,362,957 B1 | 3/2002 | Iwasaki | 361/684 |
| 6,410,355 B1 | 6/2002 | Wallace | 438/15 |
| 6,431,456 B2 | 8/2002 | Nishizawa et al. | 235/492 |
| 6,462,273 B1 | 10/2002 | Corisis et al. | 174/52.2 |
| 6,483,038 B2 | 11/2002 | Lee et al. | 174/255 |
| 6,538,331 B2 | 3/2003 | Masuda et al. | 257/777 |
| 6,552,423 B2 | 4/2003 | Song et al. | 257/679 |
| 6,573,567 B1 | 6/2003 | Nishizawa et al. | 257/358 |
| 6,612,498 B1 | 9/2003 | Lipponen et al. | |
| 6,624,005 B1 | 9/2003 | DiCaprio et al. | 438/113 |
| 6,686,663 B2 | 2/2004 | Masuda et al. | 257/777 |
| 6,858,925 B2 * | 2/2005 | Wada et al. | 257/679 |
| 7,053,471 B2 * | 5/2006 | Wada et al. | 257/679 |
| 7,233,058 B2 * | 6/2007 | Wada et al. | 257/679 |
| 2006/0264109 A1 * | 11/2006 | Brewer et al. | 439/630 |

FOREIGN PATENT DOCUMENTS

| | | |
|---|---|---|
| DE | 199 22 063 | 11/2000 |
| DE | 199 22 063 A1 | 11/2000 |
| DE | 199 29 912 | 1/2001 |
| DE | 199 29 912 A | 1/2001 |
| EP | 0 774 727 | 5/1997 |
| EP | 0774 727 A2 | 5/1997 |
| EP | 0 817 116 | 1/1998 |
| EP | 0817116 A | 1/1998 |
| EP | 0 869 452 | 10/1998 |
| EP | 0869452 A | 10/1998 |
| EP | 1 076 317 | 2/2001 |
| EP | 1 076 317 A | 2/2001 |
| JP | 62-183396 A | 8/1987 |
| JP | 63-6872 U | 1/1988 |
| JP | 63-212595 | 9/1988 |
| JP | 1-184192 | 7/1989 |
| JP | 2-158146 | 6/1990 |
| JP | 02-158394 | 6/1990 |
| JP | 02301155 | 12/1990 |
| JP | 03114788 | 5/1991 |
| JP | 3-158297 A | 7/1991 |
| JP | 6-68865 U | 9/1994 |
| JP | 6-318390 | 11/1994 |
| JP | 6-318390 A | 11/1994 |
| JP | 7-210645 | 8/1995 |
| JP | 07210645 | 8/1995 |
| JP | 9-286187 | 11/1997 |
| JP | 10-95031 | 4/1998 |
| JP | 2000-11130 | 1/2000 |
| JP | 2000-148953 | 5/2000 |
| JP | 2000-297307 | 10/2000 |
| JP | 2000-354093 A | 12/2000 |
| JP | 2001-184475 | 7/2001 |

* cited by examiner (a)

(FRONT)

(b)

(REAR)

(a)

(a)

(a)

(b)

(c)

(a)

(b)

(c)

(a)

(b)

(a)

(b)

(a)

(b)

(a)

(b)

(c)

MEMORY CARD WITH CONNECTING PORTIONS FOR CONNECTION TO AN ADAPTER

CROSS-REFERENCE TO RELATED APPLICATIONS

This application is a continuation of application Ser. No. 11/204,047 filed Aug. 16, 2005 now U.S. Pat. No. 7,239,011, which is a continuation of application Ser. No. 10/267,784 filed Oct. 10, 2002 now U.S. Pat. No. 7,053,471, which is a division of application Ser. No. 10/240,187 filed Sep. 30, 2002 (now U.S. Pat. No. 6,858,925 issued Feb. 22, 2005), which is a 371 of PCT/JP01/11640 filed Dec. 28, 2001.

TECHNICAL FIELD

The present invention relates to a semiconductor device and a method of manufacturing the same, and more particularly to a technique which can be effectively applied to a semiconductor memory card (simply referred to as "memory card" hereinafter), for example.

BACKGROUND ART

A memory card such as a multimedia card (produced by Sun Disk Inc.) or a SD card (produced by Panasonic, Toshiba Corporation, Sun Disk Inc.) is one of a storage device which stores information in a semiconductor memory chip housed in the inside thereof. This memory card can directly and electrically get access to information with respect to a non-volatile memory formed in the semiconductor memory chip. Accordingly, the memory card exhibits faster writing and reading compared to other storage device by an amount corresponding to the absence of a mechanical system control and further enables the exchange of storage mediums. Further, since the memory card is relatively mainly used as an auxiliary storage device of equipment which is requested to satisfy portability such as a portable personal computer, a port able telephone set or a digital camera. Recently, the miniaturization of the equipment is still in progress and hence, the further miniaturization of the memory card is requested along with such progress. Further, since the memory card is a novel technique, the dimensional standard has not been completely unified.

However, when the size of the memory card is to be reduced or the size of the memory card differs between countries, the manner how to maintain the compatibility in size with existing memory cards and the manner how to use the memory card with respect to equipment which are devised for existing memory cards constitute serious tasks.

The object of the present invention lies in providing a technique which can enhance the versatility of semiconductor device.

The above-mentioned and other objects as well as novel features of the present invention will become apparent from the description of this specification and attached drawings.

DISCLOSURE OF THE INVENTION

To briefly explain representative inventions among inventions disclosed in this specification, they are as follows.

That is, the present invention is characterized by providing a mounting portion having a projecting cross section to a resin-made case body which incorporates a semiconductor chip, where in a metal-made auxiliary piece for changing a planar size of the case body can be replaceably mounted on the case body by fitting a recessed portion of the auxiliary piece on the mounting portion.

Further, the present invention is characterized in that the resin-made case body covers a part mounting surface of a substrate on which a semiconductor chip is mounted, and the substrate has an area which is equal to or less than one half of a planar area of the resin-made case body.

Further, the present invention is characterized by having a step in which a case body which covers a part mounting surface of a substrate on which a semiconductor chip is mounted is molded using a mold in which a depth of cavity of a lower mold is greater than a depth of cavity of an upper mold.

Further, the present invention includes a case body, a groove formed in one surface of the case body, a substrate which is mounted in a state that a part mounting surface thereof faces the inside of the groove, and a plurality of semiconductor chips mounted on the part mounting surface, wherein a length in the longitudinal direction of the case body at the groove and the substrate is set shorter than a total length in the longitudinal direction of the case body, and in the substrate and the groove, corner portions which are positioned at the center of the case body are chamfered.

BRIEF DESCRIPTION OF THE DRAWINGS

FIG. 20 is mounted on a groove of the cap shown in FIG. 21 and FIG. 22.

FIG. 25 is mounted on the cap shown in FIG. 26 and FIG. 27.

FIG. 38 is a cross-sectional view of one example of a mold for molding the cap of the semiconductor device shown in FIG. 26 to FIG. 29 and the like.

BEST MODE FOR CARRYING OUT THE INVENTION

Figure 1:
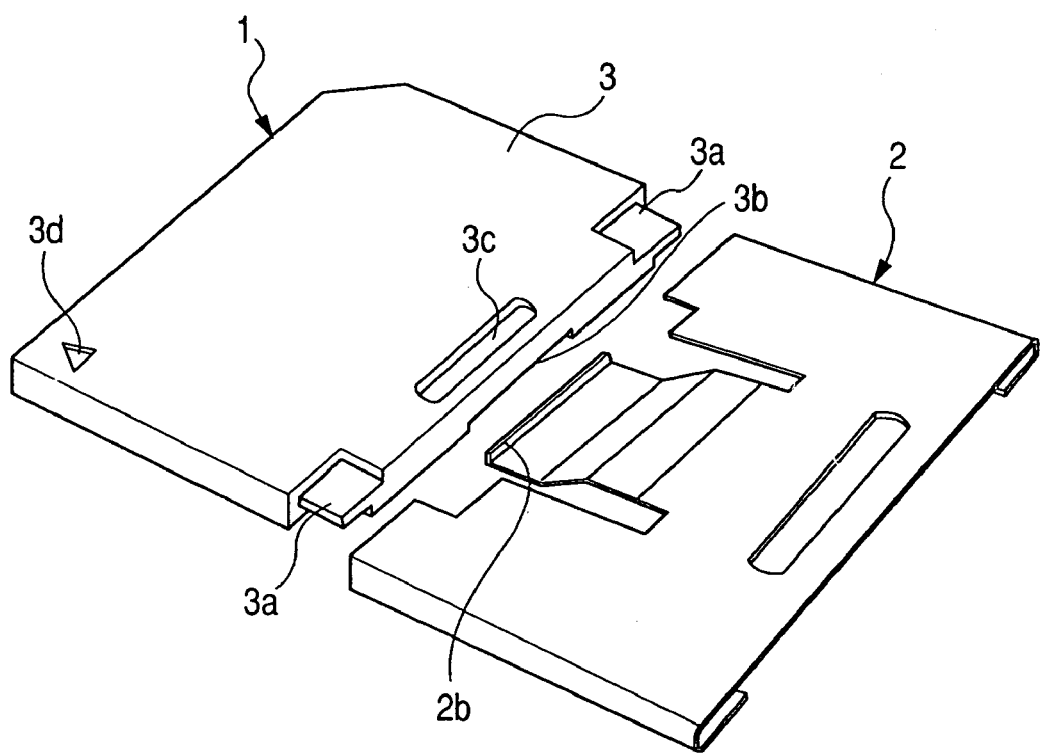
FIG. 1 is a perspective view of a semiconductor device and an auxiliary piece which constitute one embodiment of the present invention.

In embodiments described hereinafter, when it is necessary for the sake of convenience, the explanation is made by dividing the invention into a plurality of sections or a plurality of embodiments. However, unless otherwise specified particularly, these embodiments are not irrelevant to each other and there exists the relationship that one embodiment is a modification, a detailed explanation or a complementary explanation of a portion or the whole of other embodiment.

Further, in the embodiments described hereinafter, when the reference is made with respect to the number and the like (including number, numerical values, quantity, range and the like) of elements, unless otherwise specified and unless otherwise the number and the like of elements are definitely limited to the specific number in principle, the number and the like are not limited such specific number and may be a number above or below the specific number.

Further, in the embodiment described hereinafter, it is needless to say that the constituent elements (including element steps and the like) are not always indispensable unless otherwise specified or unless they are considered indefinitely indispensable in principle.

In the same manner, in the embodiments described hereinafter, when the reference is made with respect to the shape, the positional relationship and the like of the constituent elements, unless otherwise specified or unless it is indefinitely considered unreasonable, these shapes and positional relationship substantially include those which approximate or a similar to these shapes. The same goes for the above-mentioned numerical values and ranges.

Further, in all drawings which are used for explaining the embodiments of the present invention, the constitutional elements which have the same functions are given same symbols and the repeated explanation thereof is omitted.

Still further, in the drawings which are used for this embodiment, hatching may be provided also to the plan view for facilitating the understanding of the drawing.

Hereinafter, the preferred embodiments of the present invention are described in detail in conjunction with attached drawings.

EMBODIMENT 1

Figure 2:
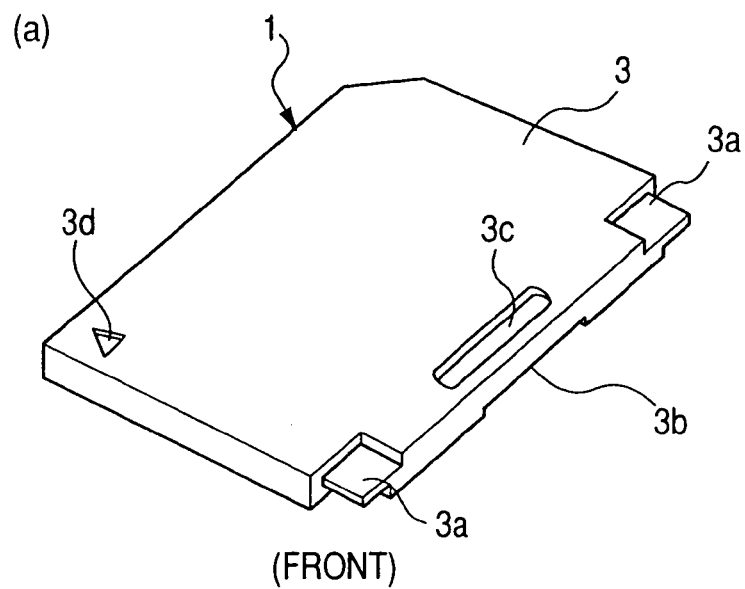
FIG. 2(a) is a perspective view showing an appearance of a front surface-side of the semiconductor device shown in FIG. 1.
FIG. 2(b) is a perspective view showing an appearance of a rear surface-side of the semiconductor device.
Figure 2:
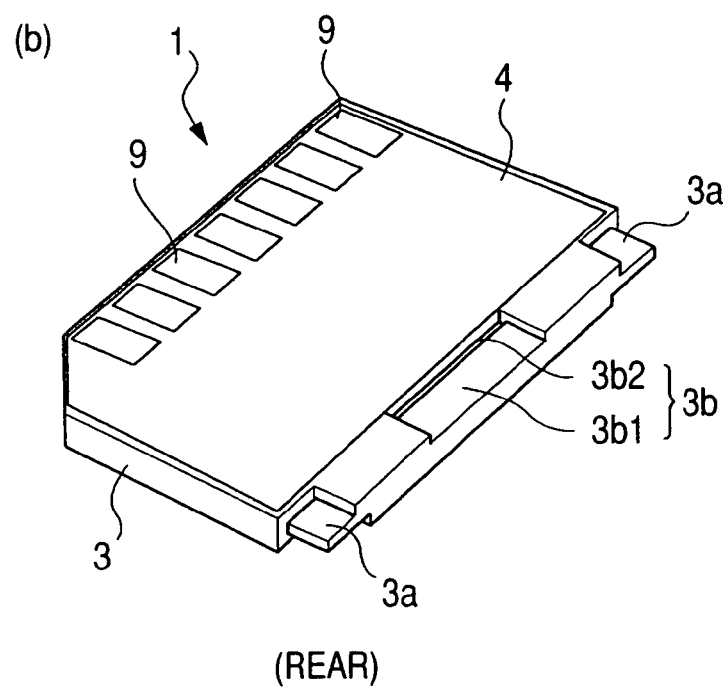
Figure 3:
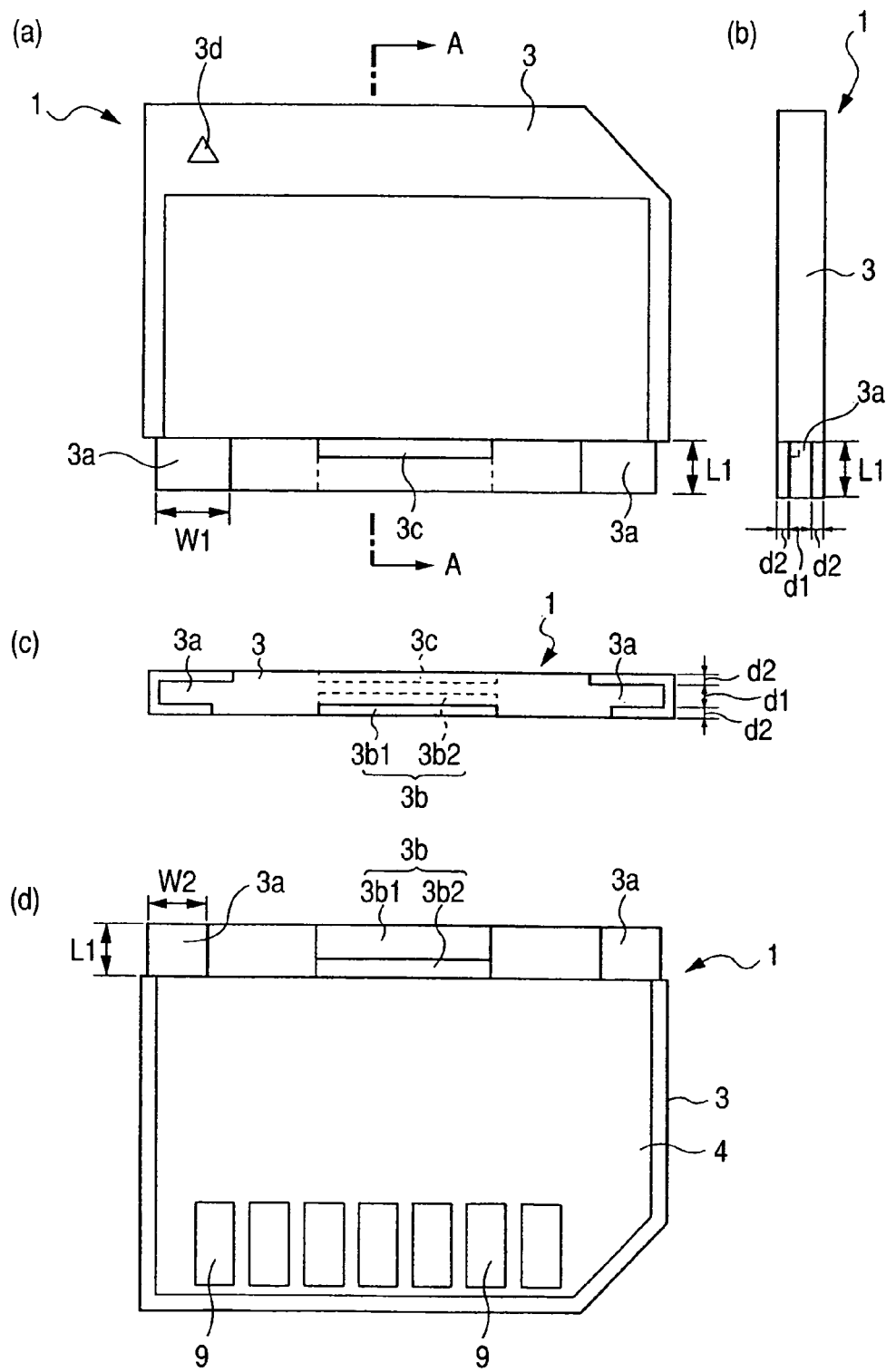
FIG. 3(a) is a plan view of a front surface side of the semiconductor device shown in FIG. 1.
FIG. 3(b) is a side view of the semiconductor device shown in FIG. 3(a)
FIG. 3(c) is a back view of the semiconductor device shown in FIG. 3(a)
FIG. 3(d) is a plan view of a rear surface-side of the semiconductor device shown in FIG. 3(a).
Figure 4:
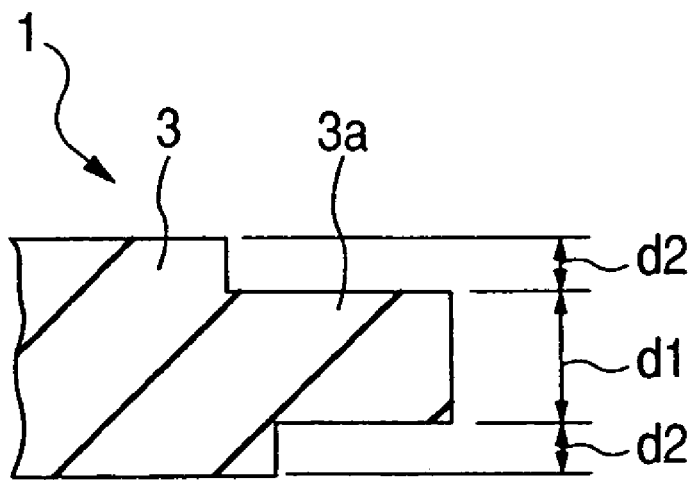
FIG. 4(a) is an enlarged cross-sectional view of an essential part of an auxiliary piece mounting portion in the longitudinal direction of the semiconductor device shown in FIG. 1.
FIG. 4(b) is an enlarged cross-sectional view of an essential part of the auxiliary piece mounting portion in the lateral direction of the semiconductor device shown in FIG. 1.
Figure 4:
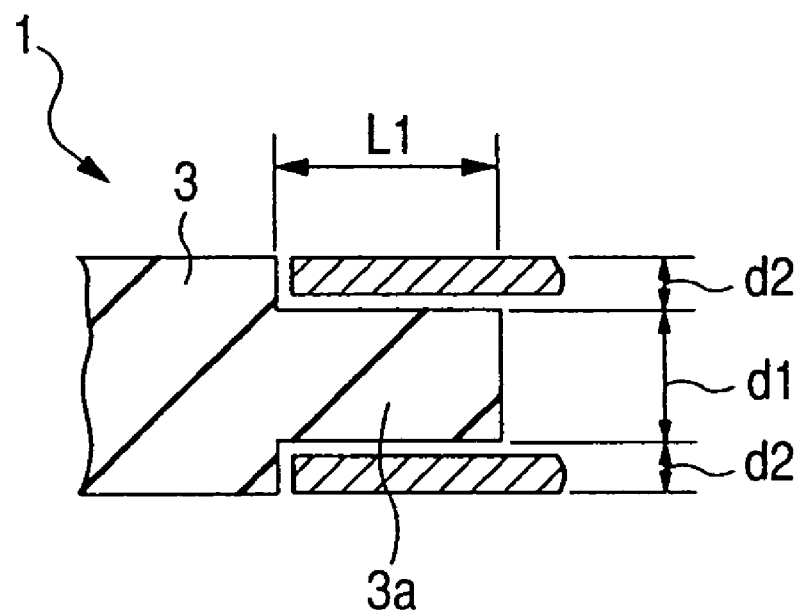
Figure 5:
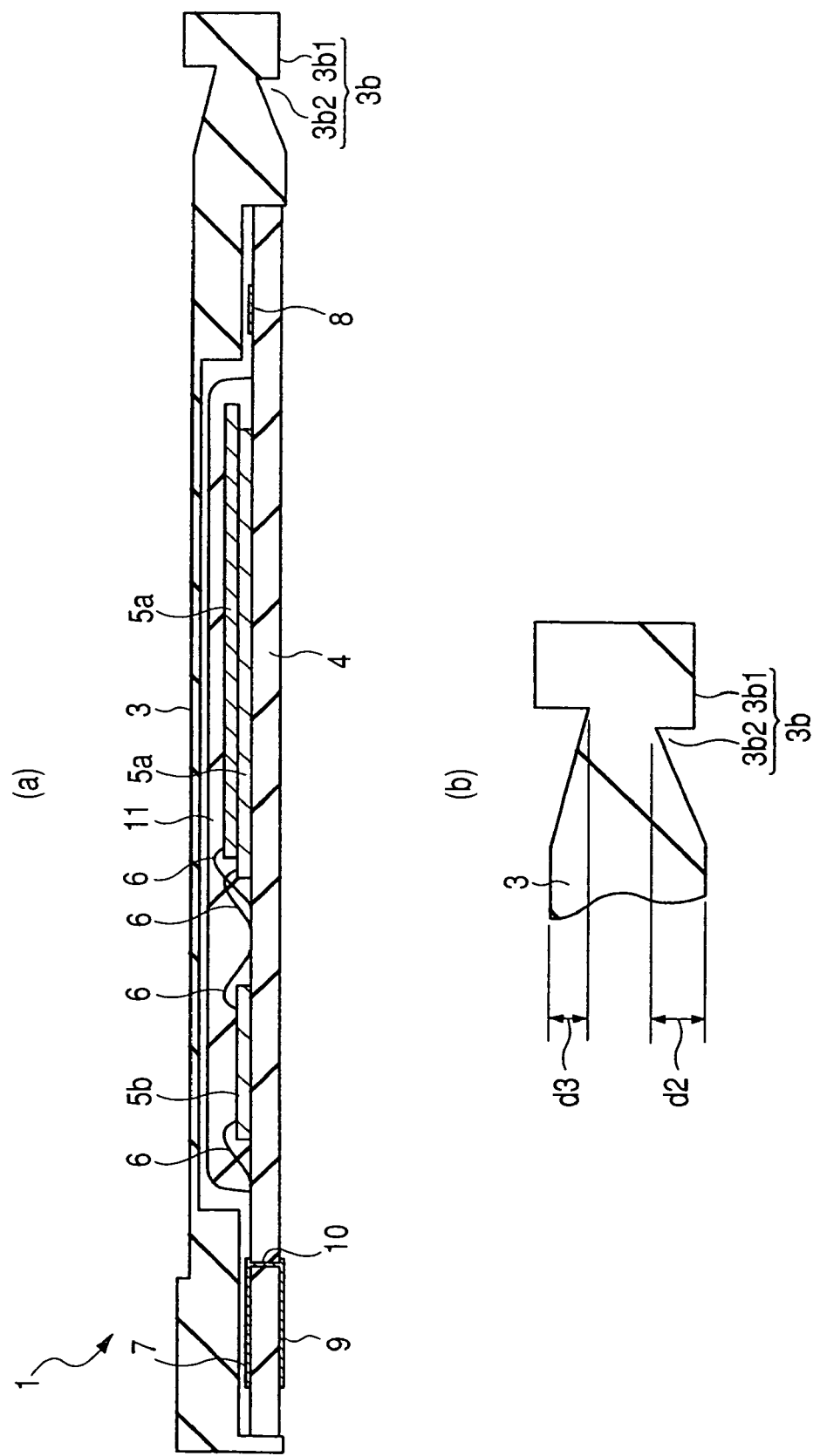
FIG. 5(a) is a cross-sectional view taken along a line A-A in FIG. 3(a)
FIG. 5(b) is an enlarged cross-sectional view of an essential part of FIG. 5(a).
Figure 6:
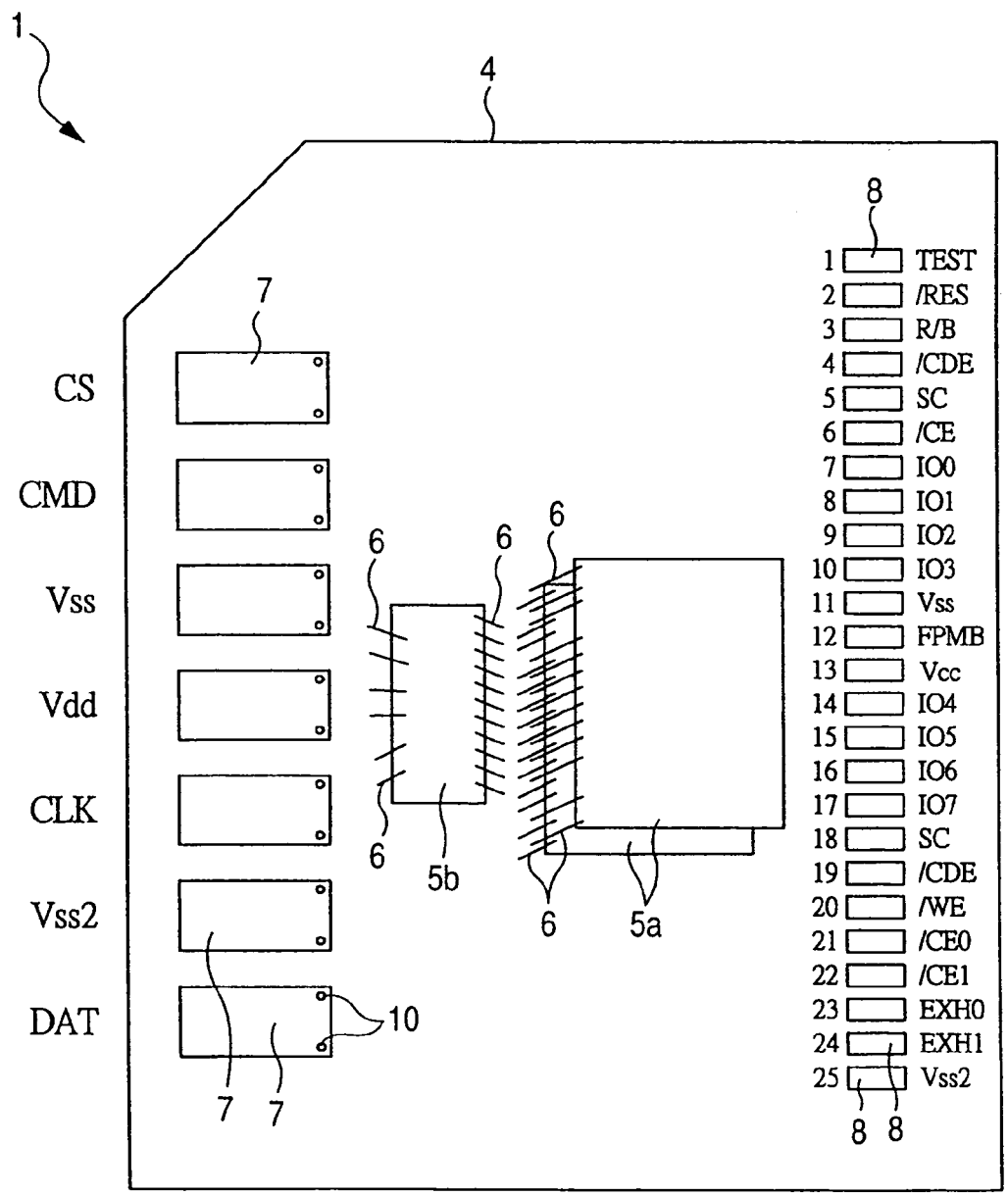
FIG. 6 is a plan view of a base substrate of the semiconductor device shown in FIG. 1.

FIG. 1 is a perspective view of a semiconductor device and an auxiliary piece which constitute one embodiment of the present invention, FIG. 2(*a*) and FIG. 2(*b*) are perspective views showing an appearance of a front surface-side and an appearance of a rear surface-side of the semiconductor device shown in FIG. 1, FIG. 3(*a*) is a plan view of a front surface-side of the semiconductor device shown in FIG. 1, FIG. 3(*b*) is a side view of the semiconductor device shown in FIG. 3(*a*), FIG. 3(*c*) is a back view of the semiconductor device shown in FIG. 3(*a*), FIG. 3(*d*) is a plan view of a rear surface-side of the semiconductor device shown in FIG. 3(*a*), FIG. 4(*a*) is an enlarged cross-sectional view of an essential part of an auxiliary piece mounting portion in the longitudinal direction of the semiconductor device shown in FIG. 1, FIG. 4(*b*) is an enlarged cross-sectional view of an essential part of the auxiliary piece mounting portion in the lateral direction of the semiconductor device shown in FIG. 1, FIG. 5(*a*) is a cross-sectional view taken along the lateral direction (line A-A) of the semiconductor device shown in FIG. 3(*a*), FIG. 5(*b*) is an enlarged cross-sectional view of an essential part of FIG. 5(*a*), and FIG. 6 is a plan view of a base substrate of the semiconductor device.

The semiconductor device according to this embodiment is a memory card 1 which can be used as an auxiliary storage device of an electronic device such as information equipment, communication equipment or the like, for example. This memory card 1 is formed of a small thin plate having a planar rectangular shape, for example. With respect to dimensions of the profile, a length of long sides is set to approximately 24 mm, a length of short sides is set to approximately 18 mm and a thickness is set to approximately 1.4 mm, for example. Provided that these dimensions of the profile are maintained, the memory card 1 can be used for a miniaturized electronic device such as a portable telephone set, a digital camera or the like, for example. However, by mounting a metal-made adapter (auxiliary piece) 2 on the memory card 1, the memory card is configured to be used for a relatively large-sized electronic device such as a portable personal computer or the like. Here, the memory card which can be directly used for the above-mentioned large-sized electronic device is named as a full-size memory card and the memory card 1 of this embodiment which can be used for the above-mentioned miniaturized electronic device is also named as a half-size memory card.

A cap (case body) 3 which defines the profile of the memory card 1 is formed of resin having insulation property such as ABS resin or PPE (Poly Phenylen Ether) from a viewpoint of making the cap 3 light-weighted, facilitating machining of the cap and imparting flexibility. The cap 3 is applied to abase substrate 4 such that the cap 3 covers a part mounting surface side on which semiconductor chips (hereinafter simply referred to as "chips") 5*a*, 5*a*, 5*b* are mounted. With respect to the cap 3, on two portions arranged at both corner portions of a rear surface side of the memory card 1, adapter mounting portions 3*a* having a projecting cross section are formed. These adapter mounting portions 3*a* are portions on which recessed portions 2*a* of the adapter 2 are fitted. These adapter mounting portions 3*a* are formed by indenting a front surface, a side surface and a rear surface of the cap 3 by an mount corresponding to a plate thickness of the adapter 2 compared to the front surface, the side surface and the rear surface of portions of the cap 3 other than the adapter mounting portion 3*a*. That is, the adapter mounting portion 3a is formed such that a thickness thereof is slightly smaller than a thickness of the memory card 1.

According to this embodiment, by providing the projecting cross section to the adapter mounting portions 3a formed on the cap 3 of the memory card 1, compared to a case in which the adapter mounting portions 3a are formed in a recessed shape, the mechanical strength of the adapter mounting portion 3a can be increased twice or more.

When the adapter mounting portions 3a have a recessed cross section, it is necessary to provide two projecting portions in the thickness direction of the memory card 1. However, since there exists an upper limit with respect to the thickness of the memory card 1 and hence, it is difficult for respective projecting portions to ensure the sufficient thickness. The cap 3 is constituted of resin from the viewpoint of making the cap 3 light-weighted, facilitating machining of the cap 3 and imparting flexibility to the cap. Accordingly, when the thickness of respective projecting portions at the recessed portion which constitute the adapter mounting portion is excessively thin, it is difficult to ensure the mechanical strength. On the other hand, when the thickness of respective projecting portions at the recessed portion is excessively increased, the formation of the recessed portion per se becomes difficult. On the contrary, as in the case of this embodiment, when the adapter mounting portion 3a has the projecting cross section, it is sufficient to provide only one adapter mounting portion 3 in the thickness direction of the memory card 1. That is, respective projecting portions which are formed by forming the adapter mounting portion 3 in the recessed shape are collected at one portion so that the projecting portion having relatively thick wall can be formed. Here, one half (d1/2) of the thickness of the adapter mounting portion 3a having the projecting cross section can be increased to a value substantially equal to the thickness d2 of the indentation. That is, it is possible to obtain the relationship Max (d1/2)=d2 (see FIG. 3(a) to FIG. 3(c), FIG. 4(a)). Accordingly, it is possible to make the adapter mounting portion 3a have a relatively large thickness and hence, even when the adapter mounting portion 3a is constituted of a portion of the resin-made cap 3, the adapter mounting portion 3a can ensure the mechanical strength. Further, since the adapter mounting portion 3a has the projecting cross section, the adapter mounting portion 3a can be easily formed. Further, to consider a case in which the adapter 2 and the cap 3 are formed of the same resin, it is possible to reduce the thickness of the adapter mounting portions 3a to a level which satisfies the relationship d1=d/3 while ensuring the mechanical strength which is obtained when the relationship d1=d2 is established.

Further, in this embodiment, since the adapter mounting portions 3a are formed at two portions arranged at both corner portions of the rear surface side of the memory card 1, the adapters 2 are snuggly fitted into both longitudinal end portions of the rear surface side of the memory card 1 so that it is possible to enhance the stability when the adapter 2 is mounted on the memory card 1.

Further, in this embodiment, with respect to the cap 3, the portion which is sandwiched by the adapter mounting portions 3a, 3a arranged at the above-mentioned both corner portions, that is, the longitudinally center portion of the rear surface side of the memory card 1 is formed to have substantially the same thickness as the thickness of the memory card 1 and is set greater than the thickness of the adapter mounting portion 3a. Due to such a constitution, compared to a case in which the rear surface side of the memory card 1 is totally made thin along the longitudinal direction of the memory card 1, the mechanical strength at contacting portions between the cap 3 and the adapter 2 can be enhanced.

Further, in this embodiment, since the adapter mounting portions 3a have the projecting cross section, it is possible to sufficiently ensure the length of the adapter mounting portion 3a (lateral length of the memory card 1) L1, that is, the length in the direction to make the recessed portion 2a of the adapters 2 fitted into the adapter mounting portions 3a as well as the length along which the recessed portions 2a overlap the adapter mounting portions 3a. When the adapter mounting portions 3a have the recessed cross section, as described above, to consider the assurance of the strength of the respective projecting portions at the recessed portion, it is difficult to sufficiently increase the length L1. On the contrary, in this embodiment, it is possible to ensure the thickness of the adapter mounting portions 3a and hence, it is possible to ensure the mechanical strength of the adapter mounting portions 3a. Accordingly, the length L1 can be elongated to some extent. Here, the length L1 is set greater than the thickness d1 of the adapter mounting portion 2a. That is, it is possible to establish the relationship L1>d1. In this manner, by elongating the length L1 of the adapter mounting portions 3a, the adapter mounting portions 3a of the memory card 1 can be firmly suppressed by the recessed portion 2a of the adapter 2 so that the rigidity of a connecting portion between the memory card 1 and the adapter 2 can be ensured. Accordingly, a drawback that the connecting portion between the memory card 1 and the adapter 2 breaks due to bending or the like can be reduced or prevented.

Further, in this embodiment, the state of the adapter mounting portions 3a is made asymmetric with respect to the front surface-side and the rear surface-side of the memory card 1. To be more specific, the widths W1, W2 of the adapter mounting portions 3a (longitudinal length of the memory card 1) are made asymmetric and the dimensions of respective widths W1, W2 are different from each other (see FIG. 3). Here, the width W1 of the front surface side is set wider than the width W2 of the rear surface side, for example. This provision is made to prevent the error in mounting direction of the adapter 2. That is, since the dimensions of the widths W1, W2 of the adapter mounting portions 3a are different from each other, when the mounting direction of the adapter 2 is in error, the adapter 2 cannot be mounted. Accordingly, it is possible to prevent the occurrence of damage or rupture on the memory card 1 derived from the erroneous mounting of the adapter 2. Further, it is unnecessary for a user to particularly pay an attention to the correct or erroneous mounting direction of the memory card 1 and hence, the user can mount the adapter 2 on the memory card 1 in a relaxed mode and this enables the stable handling of the memory card 1 with respect to the card mounting equipment.

Further, in this embodiment, in the vicinity of the back-face side of the rear surface-side of the memory card 1, at the longitudinal center of the memory card 1, an adapter pawl mounting portion 3b is formed. The adapter pawl mounting portion 3b is a portion which catches a pawl portion 2b of the adapter 2 and is constituted of an indented portion 3b1 and a groove portion 3b2. The indented portion 3b1 is formed such that the rear surface of the cap 3 is indented by an amount of plate thickness of the adapter 2 extending over from the back face of the memory card 1 to the groove portion 3b2. Further, the groove portion 3b2 is formed of an indentation whose depth is deeper than a depth of an indentation of the indented portion 2b1. By allowing the entrance of the pawl portion 2b of the adapter 2 into the inside of the groove portion 3b2, the memory card 1 and the adapter 2 are firmly connected and fixed to each other.

Further, in the vicinity of the back-face of the front surface of the memory card 1, at the longitudinal center of the memory card 1, a card removing groove 3c is formed. This card removing groove 3c facilitates the removal of the memory card 1 when the memory card 1 is removed from the above-mentioned electronic device. That is, by pulling a finger parallel to the front surface of the cap 2 in a state that the finger touches the card removing groove 3c, it is possible to pull out the memory card 1 from the above-mentioned electronic device. A depth d2 of the groove portion 3b2 formed in the rear surface-side of the above-mentioned memory card 1 is set greater than a depth d3 of the card removing groove 2c formed in the front surface-side of the memory card 1 (see FIG. 5(b)).

Here, from a viewpoint of enhancement of recognition of the mounting direction of the memory card 1, a corner of the frontal-face side of the memory card 1 is notched. Further, on the front surface of the cap 3 of the memory card 1, in the vicinity of the frontal face of the memory card 1, a mark 3d having a planar triangular shape which indicates the insertion direction at the time of inserting the memory card 1 into the above-mentioned electronic device is formed.

Two chips 5a, 5a mounted on the base substrate 4 of the above-mentioned memory card 1 have the same profile dimensions and flash memories (EEPROM) having the same storage capacity are formed in the chips 5a, 5a. These chips 5a, 5a are mounted on the base substrate 4 such that the other chip 5a is superposed on one chip 5a. The chip 5a constituting a lower layer is bonded to an upper surface of the base substrate 4 by an adhesive agent or the like, while the chip 5a constituting an upper layer is bonded to an upper surface of the chip 5a constituting the lower layer by an adhesive agent or the like. On the other hand, a chip 5b for controller is mounted on the base substrate 4 in the vicinity of the chips 5a for memory and is bonded to the upper surface of the base substrate 4 by an adhesive agent or the like. All of three chips 5a, 5a, 5b are mounted on the base substrate 4 in a state that main surfaces (die forming surfaces) thereof are directed upwardly.

On respective main surfaces of two chips 5a, 5a in which flash memories (EEPROM) are formed, a plurality of bonding pads are formed as an array along one sides thereof. That is, the chip 5a for memory adopts a one-side pad method in which bonding pads are formed on a peripheral portion of a die forming surface and these bonding pads are arranged in an array along one side of the peripheral portion. On the other hand, on the main surface of the chip 5b for controller, a plurality of bonding pads are formed in an array along two longitudinal sides which face each other, for example.

Two chips 5a, 5a are superposed each other in a state that they are directed in the same direction, wherein the bonding pads of one chip 5a and the bonding pads of the other chip 5a are arranged close to each other. Further, the chip 5a constituting the upper layer has a portion thereof arranged in a state that the portion is displaced in the direction (direction X) parallel to one side of the chip 5a constituting the lower layer and in the direction (direction Y) perpendicular to the direction X.

On the base substrate 4 in the vicinity of the above-mentioned chips 5a, 5b, a plurality of electrodes are formed. The bonding pads of respective chips 5a, 5a, 5b are electrically connected to corresponding electrodes through bonding wires 6 made of gold (Au) or the like. The bonding pads on the chip 5a are electrically connected to connection terminals 7 formed on one end of one main surface of the base substrate 4 and test pads 8 formed on the other end of the main surface of the base substrate 4 through the above-mentioned electrodes and lines on the base substrate 4 which are electrically connected to the electrodes. The connection terminals 7 are used as connection terminals when the memory card 1 is mounted in the above-mentioned electronic device and are electrically connected to external connection terminals 9 formed on a rear surface of the base substrate 4 via through holes 10. Further, test pads 8 are used for measuring electric characteristics in assembling steps of the memory card 1 or the like. The chips 5a, 5b, the bonding wires 6 and most of the part mounting surface of the base substrate 4 (excluding the connection terminals 7, the test pads 8 and peripheries of regions where these connection terminals 7 and test pads 8 are arranged) are covered with sealing resin 11 made of epoxy-based resin or the like, for example.

Figure 7:
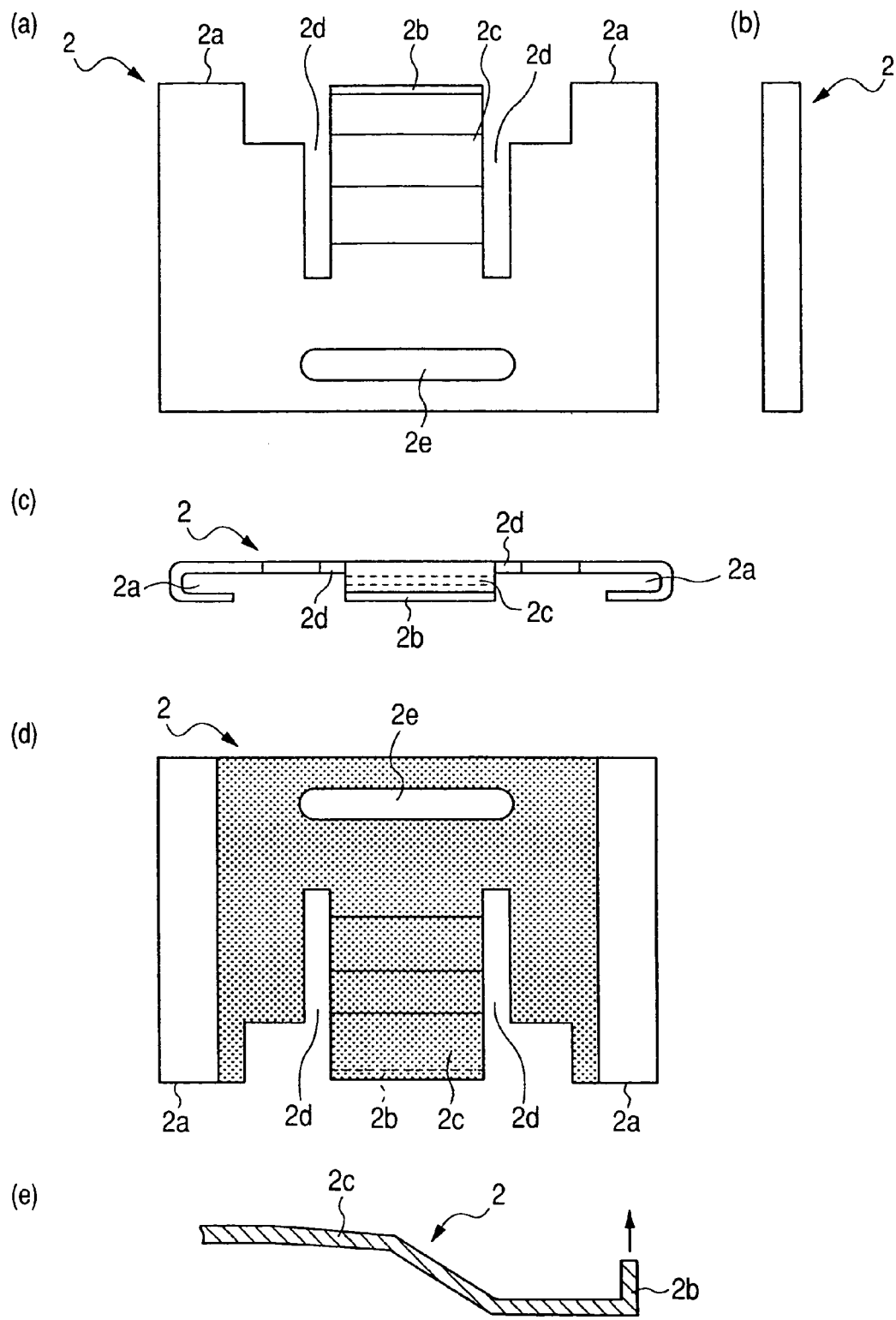
FIG. 7(a) is a plan view of a front surface side of an auxiliary base portion shown in FIG. 1.
FIG. 7(b) is a side view of the auxiliary piece shown in FIG. 7(a)
FIG. 7(c) is a back view of the auxiliary piece shown in FIG. 7(a)
FIG. 7(d) is a plan view of a rear surface-side of the auxiliary piece shown in FIG. 7(a)
FIG. 7(e) is an enlarged cross-sectional view of essential parts of a pawl portion and a support portion of the auxiliary piece shown in FIG. 7(a).

Subsequently, the above-mentioned adapter 2 is explained. FIG. 7(a) is a plan view of a front surface side of the adapter 2, FIG. 7(b) is a side view of the adapter 2 shown in FIG. 7(a), FIG. 7(c) is a front view of the adapter 2 shown in FIG. 7(a), FIG. 7(d) is a plan view of a rear surface side of the adapter 2 shown in FIG. 7(a), and FIG. 7(e) is an enlarged cross-sectional view of an essential part of a pawl portion 2b and a support portion 2c of the adapter 2 shown in FIG. 7(a).

Although the adapter 2 may be formed of resin material, the adapter 2 is formed of a metal plate having rigidity higher than that of resin material, for example, stainless steel, titanium (Ti), iron (Fe) or alloy containing iron. When stainless steel is selected as the material of the adapter 2, since stainless steel exhibits high corrosion resistance, it is unnecessary to apply surface treatment such as plating on a surface thereof. Accordingly, the formation of the adapter 2 is facilitated. Further, the manufacturing cost can be reduced. On the other hand, when iron or the like is selected as the material of the adapter 2, the corrosion resistance can be enhanced by applying plating treatment on a surface thereof.

Recessed portions 2a of the adapter 2 are formed by bending both longitudinal ends of the adapter 2 such that the recessed portions 2a have an approximately U-shaped cross section. Accordingly, the adapter 2 has a region which is vacant to some extent in the thickness direction thereof. The adapter 2 may be formed in a hollow shape.

In this manner, according to this embodiment, the adapter 2 is formed by bending a sheet of metal plate and by forming grooves 2d and a hole 2e in the metal plate. That is, this embodiment does not use metal cutting technique or the like which requires precision machining. Further, the number of parts is small. Accordingly, it is possible to reduce the manufacturing cost of the adapter 2.

In the adapter 2, the above-mentioned two grooves 2d are formed in a strip shape, wherein the grooves 2d extend from a frontal face of the adapter 2 in parallel in the lateral direction of the adapter 2 (upward and downward direction in FIG. 7(a), (d)) until the grooves 2d reach a planar position in the midst of the lateral direction. The above-mentioned support portion 2c is formed on a portion sandwiched by these two grooves 2d in plane (longitudinal center of the adapter 2). A starting end of the support portion 2c is integrally connected to the adapter 2. The other end of the support portion 2c is integrally formed with the above-mentioned pawl portion 2a. The support portion 2c has a function of a leaf spring (resilient body). The support portion 2c is formed in a rectangular shape in plane and is formed such that the support portion 2c is gradually bent from the front surface to the rear surface of the adapter 2 in cross section. That is, the support portion 2c is formed with flexibility. In this manner, by providing the flexibility to the support portion 2c, the resiliency is enhanced and, at the same time, the durability of the support portion 2c as the resilient body can be enhanced. In this manner, it is preferable that the length of the support portion 2c is designed to a length which can impart a proper resiliency to the support portion 2c.

Further, the hole 2e is formed in the vicinity of the back-face side of the adapter 2. There may be a case that when the memory card 1 is mounted in the electronic device in a state that the adapter 2 is mounted on the memory card land, thereafter, the memory card 1 is to be removed from the electronic device, it is difficult to remove the memory card 1 from the electronic device. In such a case, it is preferable to take out the memory card 1 by engaging a pawl or a tool with this hole 2e. The hole 2e may be formed in a squeezed shape such as a groove in place of a hole.

Figure 8:
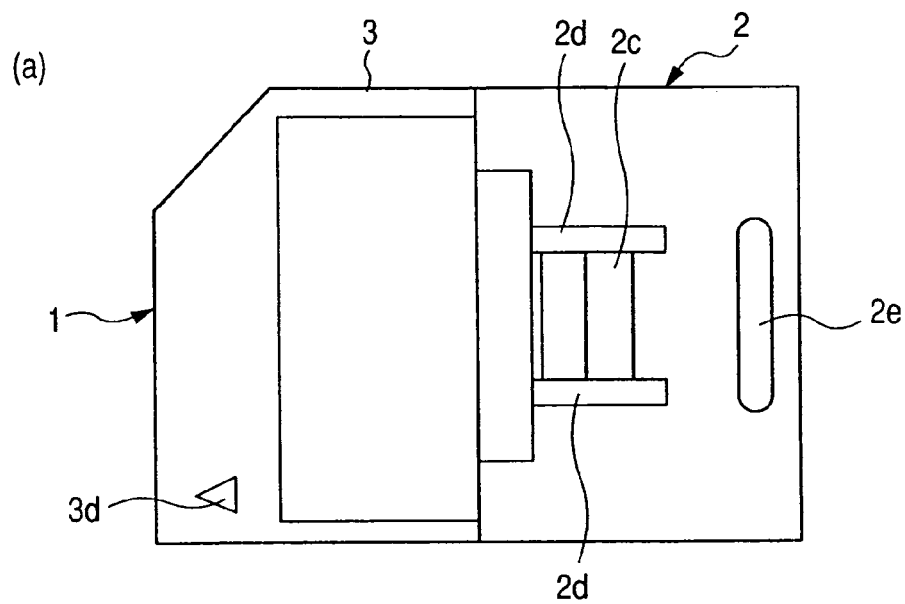
FIG. 8(a) is a plan view of front surfaces of the semiconductor device and the auxiliary piece shown in FIG. 1.
FIG. 8(b) is a side view of FIG. 8(a)
FIG. 8(c) is a plan view of a rear surface of FIG. 8(a).
Figure 8:
Figure 8:
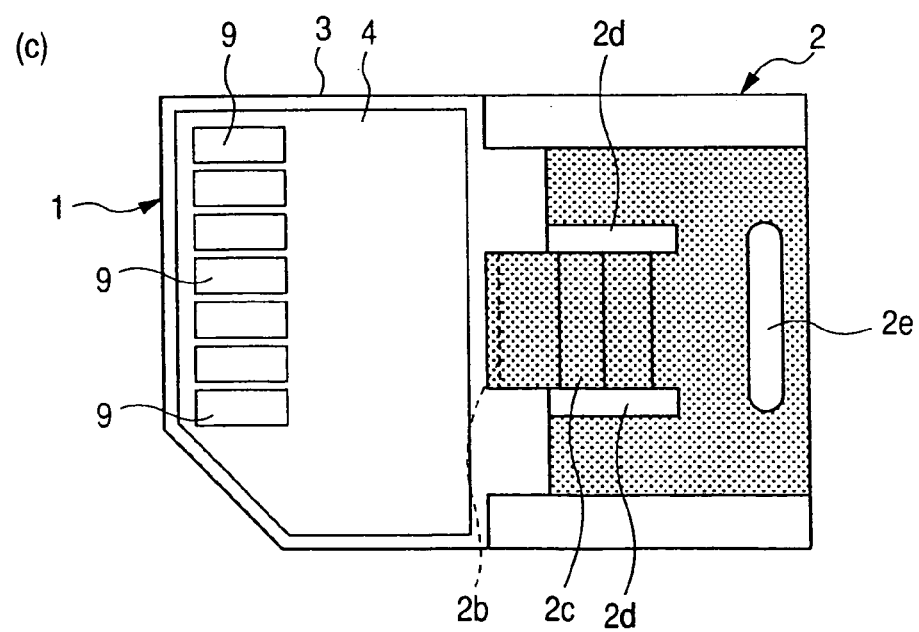
Figure 9:
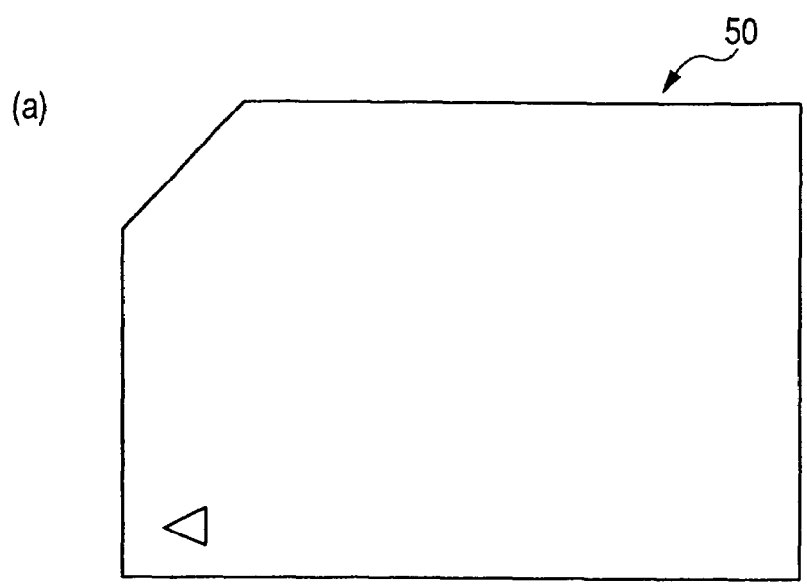
FIG. 9(a) is a plan view of a front surface of an existing full-size semiconductor device.
FIG. 9(b) is a side view of FIG. 9(a)
FIG. 9(c) is a plan view of a rear surface of FIG. 9(a).
Figure 9:
Figure 9:
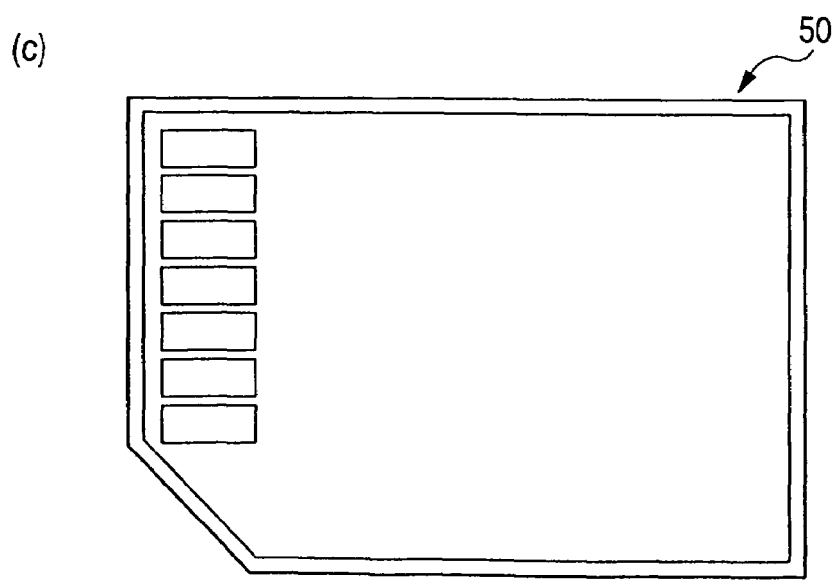

FIGS. 8(a) to 8(c) show a state in which the above-mentioned adapter 2 is mounted in the above-mentioned memory card 1. FIG. 8(a) is a plan view of the front surfaces of the memory card 1 and the adapter 2, FIG. 8(b) is a side view of FIG. 8(a), and FIG. 8(c) is a plan view of rear surfaces of FIG. 8(a). Further, FIG. 9(a) to 9(c) show the above-mentioned full-size memory card 50 for comparison. FIG. 9(a) is a plan view of a front surface of the memory card 50, FIG. 9(b) is a side view thereof, FIG. 9(c) is a plan view of a rear surface thereof. Further, FIG. 10(a) shows a cross section of a connecting portion of the adapter pawl mounting portion 3b of the memory card 1 and the pawl portion 2b of the adapter 2, and FIG. 10(b) shows a cross section of the connecting portion of the adapter mounting portion 3a of the memory card 1 and the recessed portion 2a of the adapter 2.

The adapter 2 is mounted on the memory card 1 in the state that the adapter mounting portion 3a of the memory card 1 is fitted into the inside of the recessed portion 2a and the pawl portion 2b formed on the distal end of the support portion 2c of adapter 2 is fitted into the inside of the groove portion 3b2 of the adapter pawl mounting portion 3b of the memory card 1. Particularly, the support portion 2c of the adapter 2 is mounted in the memory card 1 in the state that the support portion 2c enters a rear surface side from the front surface side of the memory card 1. By mounting the adapter 2 on the memory card 1, the memory card 1 has the dimensions (32 mm×24 mm×1.4 mm, for example) which are equivalent to the dimensions of full-size memory card 50. Accordingly, the half-size memory card 1 which is available for the above-mentioned miniaturized electronic device is also available for the above-mentioned large-sized electronic device for the full-size memory card 50. That is, it is possible to enhance the versatility of the half-size memory card 1.

Figure 10:
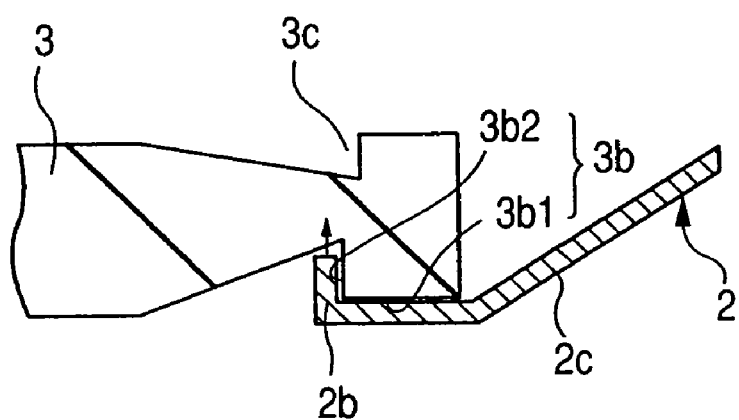
FIG. 10(a) is an enlarged cross-sectional view of an essential part of a bonding portion between an auxiliary piece pawl mounting portion of the semiconductor device in the state shown in FIG. 8 and the pawl portion of the auxiliary piece.
FIG. 10(b) is an enlarged cross-sectional view of an essential part of a bonding portion between the auxiliary piece mounting portion of the semiconductor device in the state shown in FIG. 8 and a recessed portion of the auxiliary piece.
Figure 10:
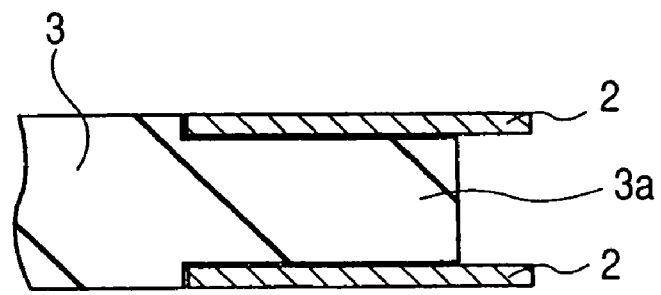

The pawl portion 2b of the adapter 2 is firmly fitted into the inside of the groove portion 3b2 of the adapter pawl mounting potion 3a of the memory card 1 in the state that the pawl portion 2b has resiliency in the upward direction shown in FIG. 10(a), that is, in the direction which faces the cap 3. Due to such a constitution, it is possible to surely connect the memory card 1 to the adapter 2. Further, the adapter mounting portion 3a of the memory card 1 is fitted in the recessed portion 2a of the adapter 2. Due to such a constitution, it is possible to connect the memory card 1 and the adapter 2 in a stable manner.

To remove the adapter 2 from the memory card 1, the support portion 2c of the adapter 2 may be pushed downwardly in the direction of the rear surface from the front surface side of the adapter 2 so as to disengage the pawl portion 2b formed on the distal end of the support portion 2c from the adapter pawl mounting portion 3b of the memory card 1. Accordingly, the adapter 2 can be easily removed with a single hand so that the removing operation can be performed extremely easily. For this end, it is preferable that the length of the support portion 2c observed from the front surface of the memory card 1 at the time of mounting is of a size which allows the insertion of a finger of a person. Here, since the support portion 2c has the resiliency as mentioned above, the support portion 2c returns to the original shape when the adapter 2 is removed.

Figure 11:
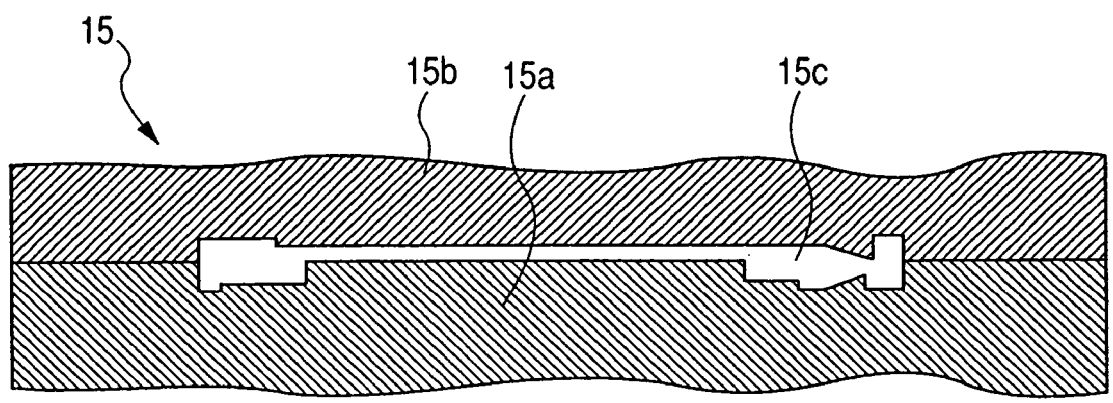
FIG. 11 is a cross-sectional view of a mold for forming one member of the semiconductor device shown in FIG. 1.
Figure 12:
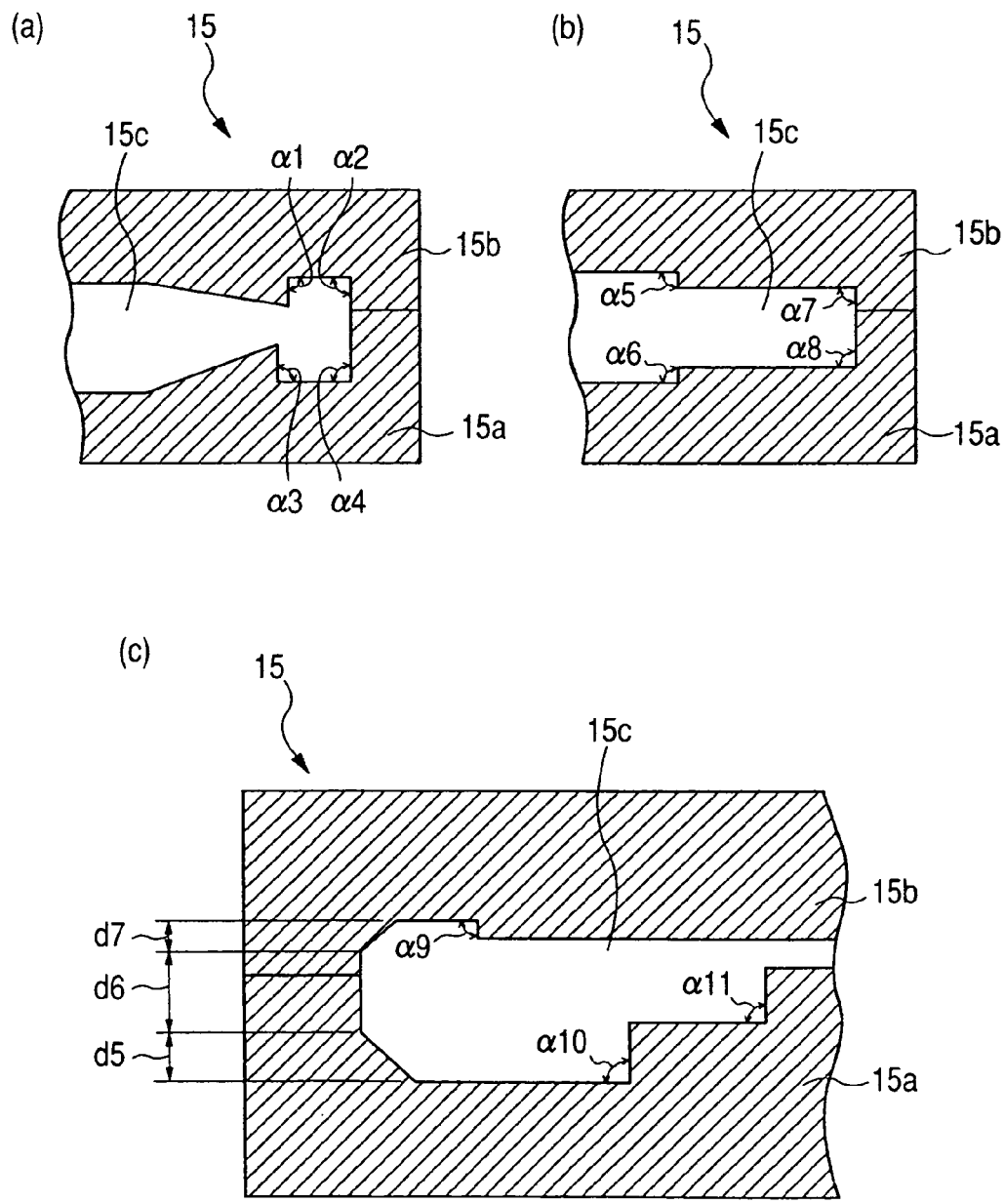
FIGS. 12(a) to 12(c) indicate enlarged cross-sectional views of the essential part shown in FIG. 11.

Subsequently, one example of a mold served for forming the cap 3 of the memory card 1 is explained. FIG. 11 is a cross-sectional view of a mold 15 and shows a cross section at the same portion as FIG. 5. Further, FIGS. 12(a) to 12(c) are enlarged cross-sectional views of an essential part shown in FIG. 11, wherein FIG. 12(a) is a cross-sectional view of the same portion as FIG. 5(b) at a back-face side of the cap 3, FIG. 12(b) is a cross-sectional view of a portion corresponding to the adapter mounting portion 3a at the back-face side of the cap 3, and FIG. 12(c) is a cross-sectional view of the same portion as FIG. 5 at a frontal face side of the cap 3.

At a portion where a lower mold 15a and an upper mold 15b are superposed each other, a cavity 15c for molding the cap 3 is defined. In this embodiment, angles $\alpha 1$ to $\alpha 11$ and the like of corner portions of the mold 15 (lower mold 15a and upper mold 15b) which face the cavity 15c are set to 90° or more (see FIG. 12). Due to such a constitution, the cap 3 can be easily molded. Assuming that the above mentioned angles $\alpha 1$ to $\alpha 11$ and the like are set to a value below 90°, it is difficult to peel off the cap 3 from the mold 15 after molding the cap 3 and hence, it is necessary to form the cap 3 piece by piece or to provide a particular mold structure. In this case, the manufacturing cost is pushed up. On the contrary, according to this embodiment, by setting the angles $\alpha 1$ to $\alpha 11$ and the like to 90°, there arises no such drawback and the caps 3 can be manufactured on a mass production basis. Further, no particular mold structure is necessary. Accordingly, the manufacturing cost of the memory card 1 can be reduced. Angles of corner portions of the front surface, the side surfaces and the rear surface of the cap 3 molded using such a mold 15 are set to 90° or more.

Further, in this embodiment, a depth (approximately thickness d5+d6) of the cavity 15c at the lower mold 15a side for forming the inner surface of the cap 3 is set larger than a depth (approximately equal to thickness d7) of the cavity 15c at the upper mold 15b side for forming the outer front surface of the cap 3. Then, at a portion corresponding to the thickness d6, a gate for filling resin which has a most portion thereof arranged at the lower mold 15a side is formed. The reason that the depth of the cavity 15c at the lower mold 15a side is larger than the depth of the cavity 15c at the upper mold 15b side is that the number of irregularities or steps formed on the inner side (bottom surface side) of the cavity 15c at the lower mold 15a side is larger than those of the upper mold 15b and hence, when a certain amount of resin is not ensured, it is difficult smoothly fill the cavity 15c with the resin. Further, with respect to the thicknesses d5 to d7, the thickness d6 exhibits the largest dimension. This setting is made to improve the ability of resin to be filled into the inside of the cavity 15c from the gate. That is, when the thickness d6 is excessively thin, it is difficult to allow the resin to flow into the inside of the cavity 15c through the gate. Here, the thickness d5 is set to approximately 0.5 mm, for example. The thickness d6 is set to approximately 0.6 mm, for example. The thickness d7 is set to approximately 0.3 mm, for example.

In this embodiment, the above-mentioned memory card 1 is manufactured such that the cap 3 is molded by filling the resin in the inside of the cavity of the mold 15 and, thereafter the cap 3 is applied onto the base substrate 4 such that the cap 3 covers the part mounting surface of the base substrate 4 on which the chips 5a, 5b are mounted.

Figure 13:
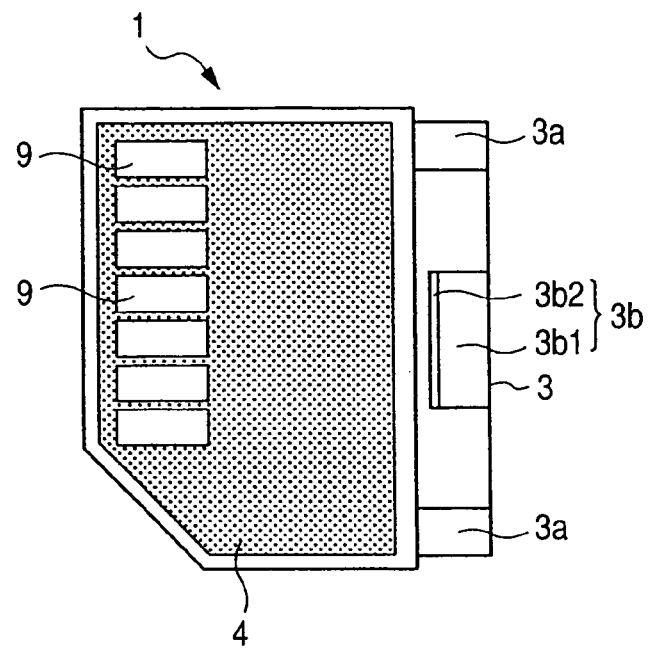
FIG. 13(a) is an overall plan view of the semiconductor device.
FIG. 13(b) is an overall plan view of a case in which a substrate of the semiconductor device shown in FIG. 13(a) is incorporated into a full-size semiconductor device.
Figure 13:
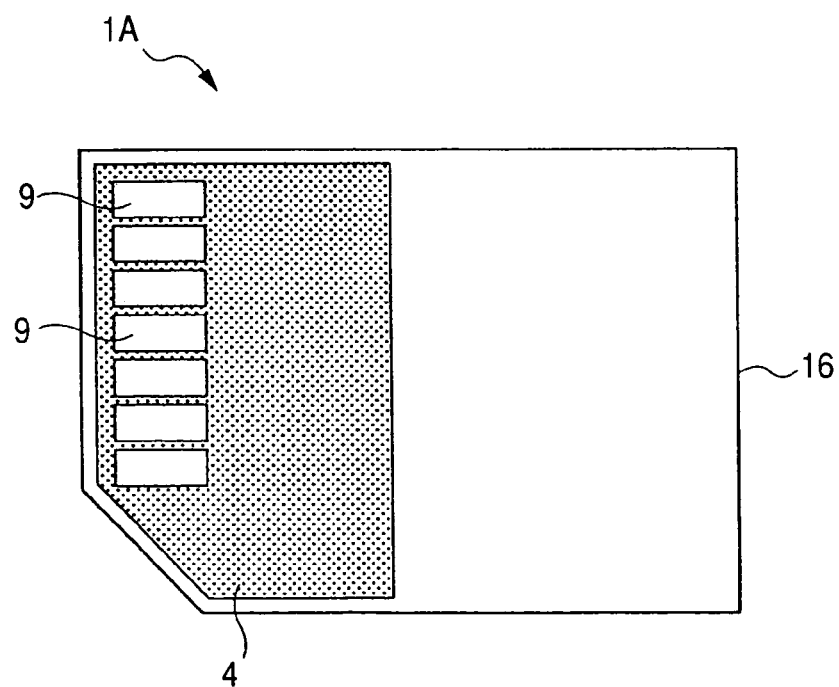

Subsequently, one example of an assembling method of the semiconductor device according to this embodiment is explained. FIGS. 13(a) and 13(b) are views for explaining such an assembling method, wherein FIG. 13(a) is an overall plan view of the memory card 1 and FIG. 13(b) is an overall plan view when the base substrate 4 of the memory card 1 is used in a state that the base substrate 4 is incorporated into the full-size memory card. A net-like hatching portion indicates a plane of the base substrate 4.

In this embodiment, the base substrate 4 (the base substrate 4 in the state that chips 5a and the like are mounted thereon) which is used for assembling the half-size memory card 1 is directly used as a full-size memory card 1A. That is, portions of the memory cards 1, 1A which differ in a planar size are shared in common.

Since the most of the manufacturing cost of the memory card is occupied by the manufacturing cost of the base substrate 4, the reduction of the manufacturing cost of the base substrate 4 is effective to reduce the manufacturing cost of the memory card 1. However, when the base substrates 4 are separately manufactured with respect to the half-size memory card 1 and full-size memory card 1A, these base substrates 4 require separate manufacturing steps, separate manufacturing devices and separate personnel and the like respectively. This incurs the increase of the manufacturing cost of the base substrates 4 so that the manufacturing cost of the memory card is increased. On the contrary, by using the base substrate 4 in common between the memory cards 1, 1A, it is unnecessary to separately provide the manufacturing steps, manufacturing devices or personnel with respect to the half-size memory card 1 and the full size memory card 1A so that it is possible to largely reduce the manufacturing cost of the memory cards 1, 1A.

When such an assembling method is adopted as shown in FIG. 13(b), the base substrate 4 having a planar area which is equal to or less than one half of a planar area of the cap 16 is mounted on the full-size memory card 1A.

EMBODIMENT 2

Figure 14:
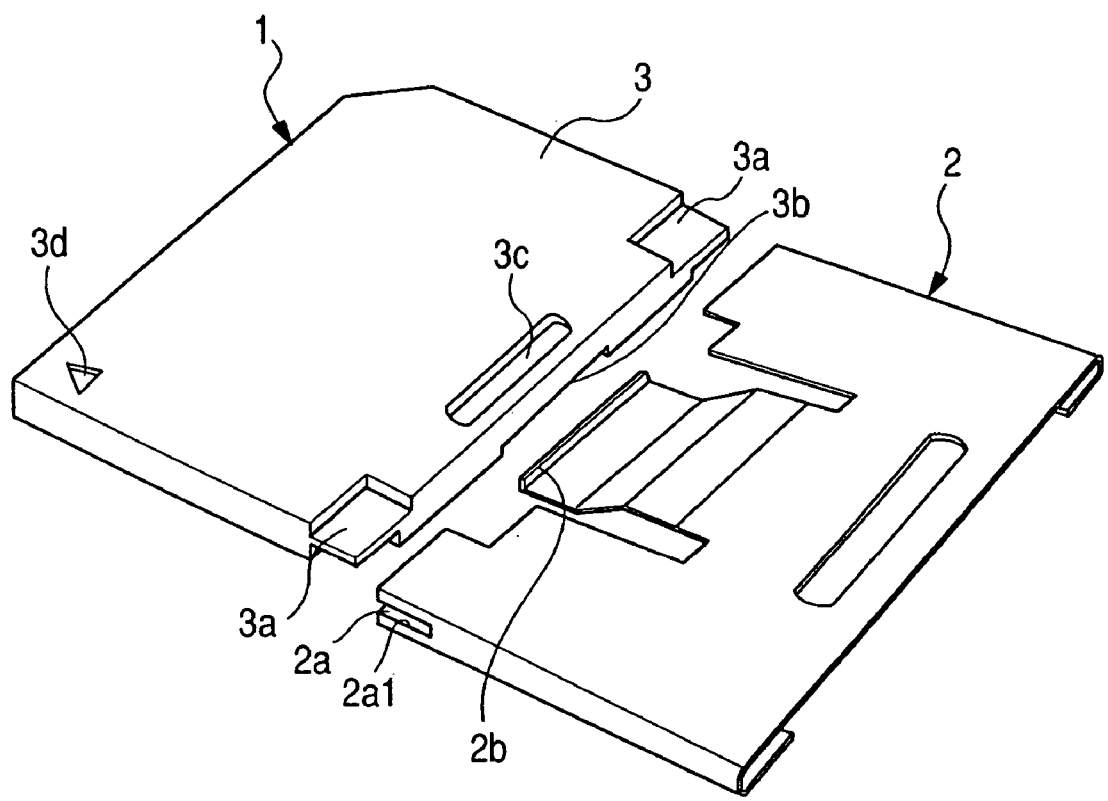
FIG. 14 is a perspective view of a semiconductor device and the auxiliary piece according to another embodiment of the present invention.
Figure 15:
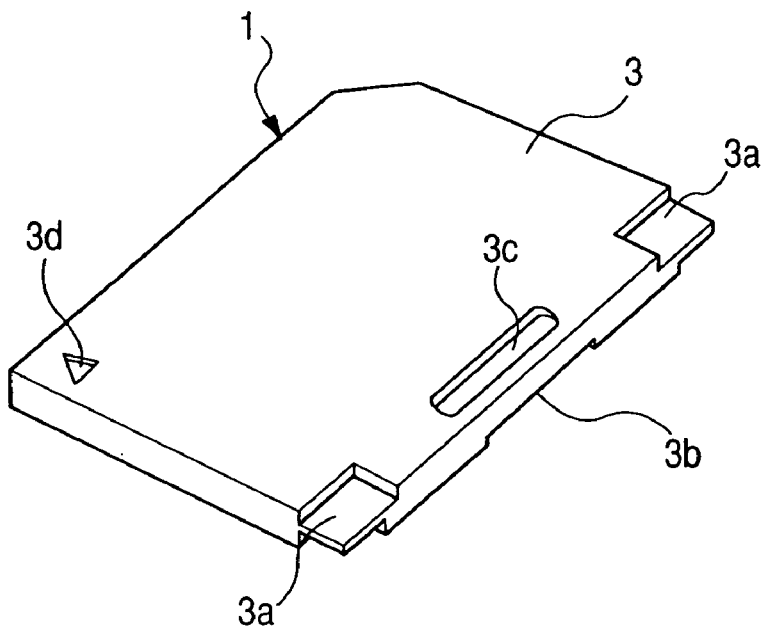
FIGS. 15(a) and 15(b) are perspective views showing an appearances of a front surface-side and a rear surface-side of the semiconductor device shown in FIG. 14.
Figure 15:
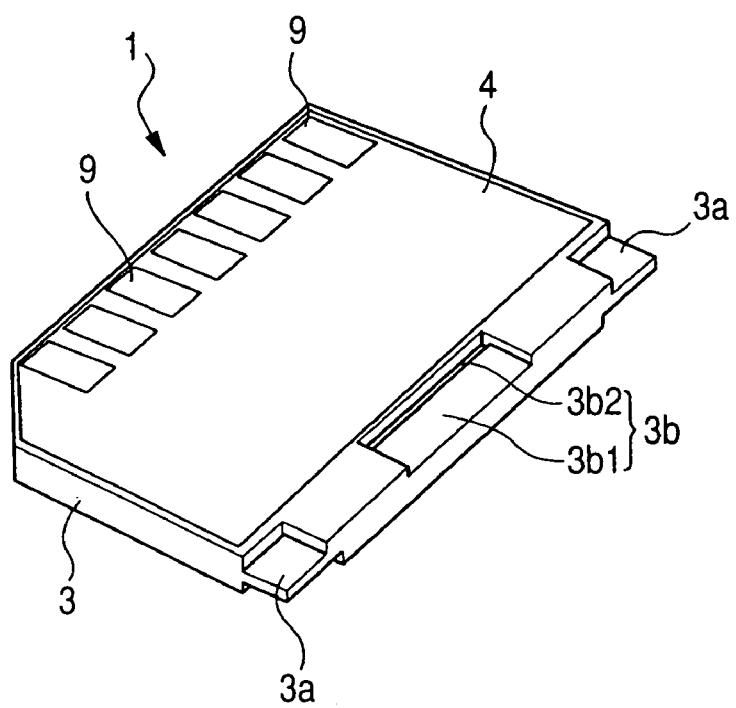
Figure 16:
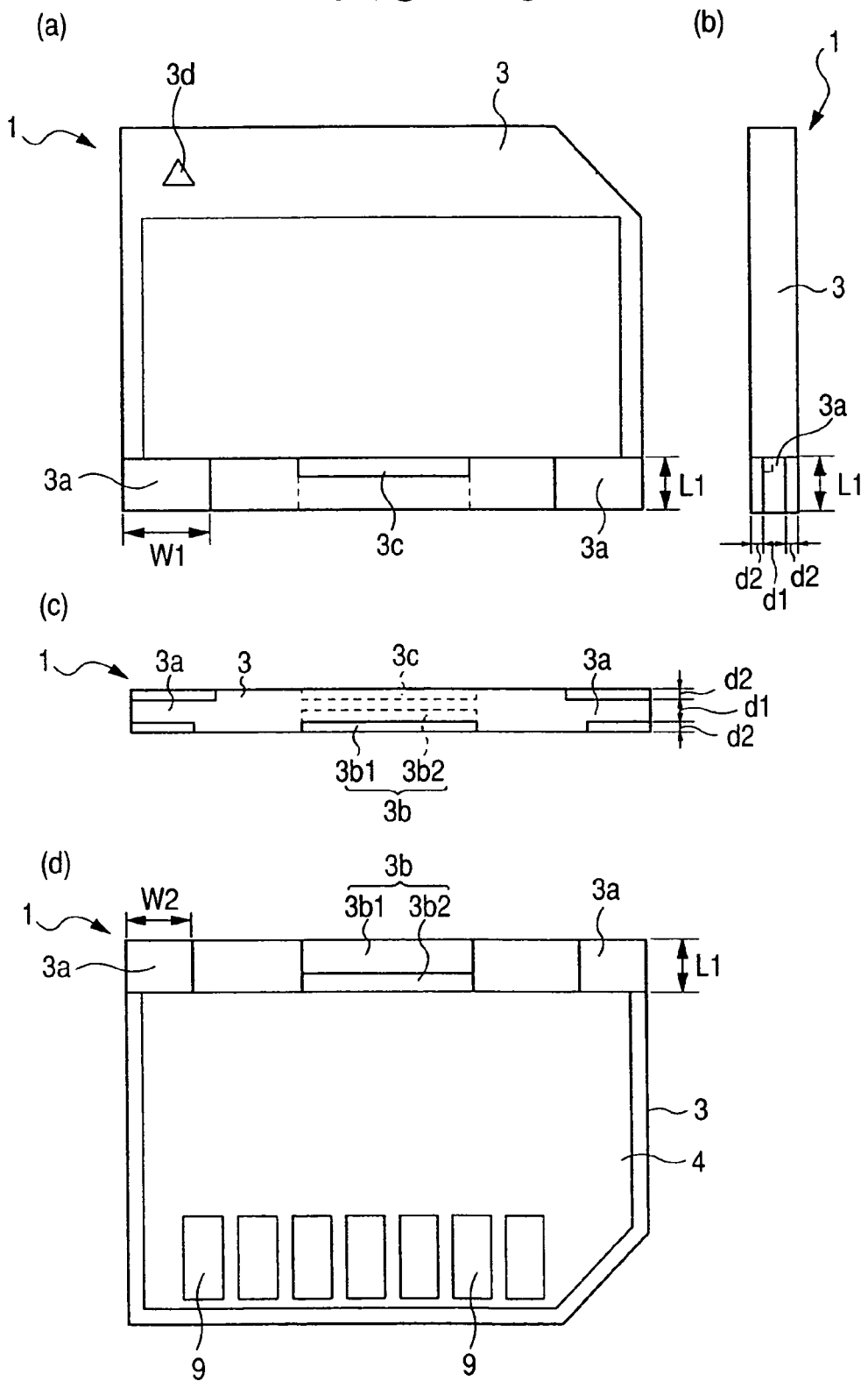
FIG. 16(a) is a plan view of a front surface-side of the semiconductor device shown in FIG. 14.
FIG. 16(b) is a side view of the semiconductor device shown in FIG. 16(a)
FIG. 16(c) is a back view of the semiconductor device shown in FIG. 16(a)
FIG. 16(d) is a plan view of a rear surface-side of the semiconductor device shown in FIG. 16(a).

FIG. 14 is a perspective view of a semiconductor device and an auxiliary piece of another embodiment of the present invention, FIGS. 15(a) and 15(b) are perspective views showing appearances of a front surface side and rear surface side of the semiconductor device shown in FIG. 14, FIG. 16(a) is a plan view of the front surface side of the semiconductor device shown in FIG. 14, FIG. 16(b) is a side view of the semiconductor device shown in FIG. 16(a), FIG. 16(c) is a back view of the semiconductor device shown in FIG. 16(a), FIG. 16(d) is a plan view of the rear surface side of the semiconductor device shown in FIG. 16(a), FIG. 17(a) is a plan view of the front surfaces of the semiconductor device and auxiliary piece shown in FIG. 14, FIG. 17(b) is a side view of FIG. 17(a), and FIG. 17(c) is a plan view of the rear surface of FIG. 17(a).

This embodiment is equal to the above-mentioned embodiment 1 except for that the shape of connecting portions between the memory card 1 and the adapter 2 differs from that of the above-mentioned embodiment 1. That is, side faces of the adapter mounting portions 3a of the memory card 1 are formed coplanar with side faces of the memory card 1. That is, the side face portions of the adapter mounting portions 3a are not indented. Further, at portions of the recessed portions 2a of the adapter 2 which are fitted into these adapter mounting portions 3a, grooves 2a1 which allow the side face portions of the above-mentioned adapter mounting portions 3a to enter also to the side faces of the memory card 1 are partially formed.

Figure 17:
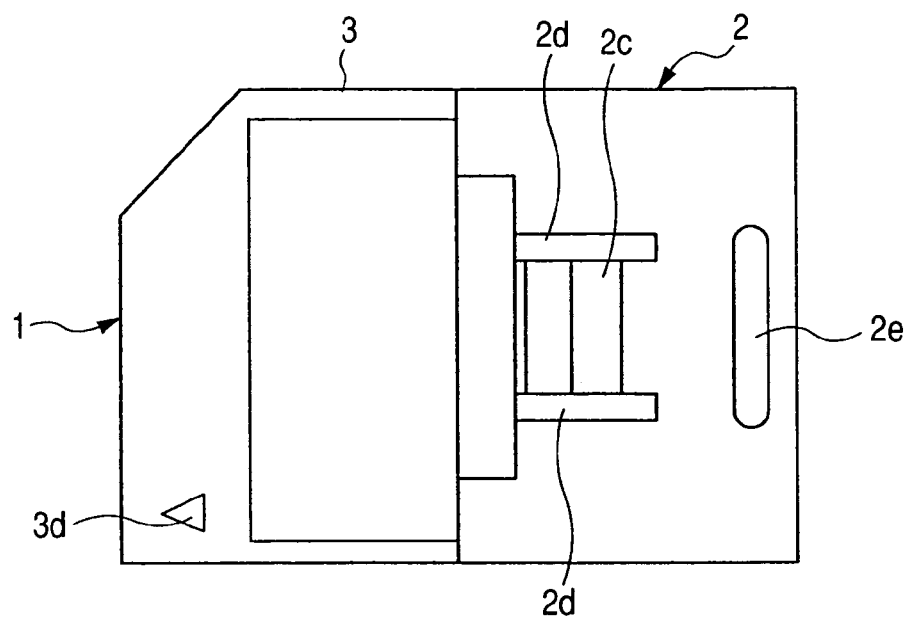
FIG. 17(a) is a plan view of front surfaces of the semiconductor device and the auxiliary piece shown in FIG. 14.
FIG. 17(b) is a side view of FIG. 17(a)
FIG. 17(c) is a plan view of a rear surface of FIG. 17(a).
Figure 17:
Figure 17:
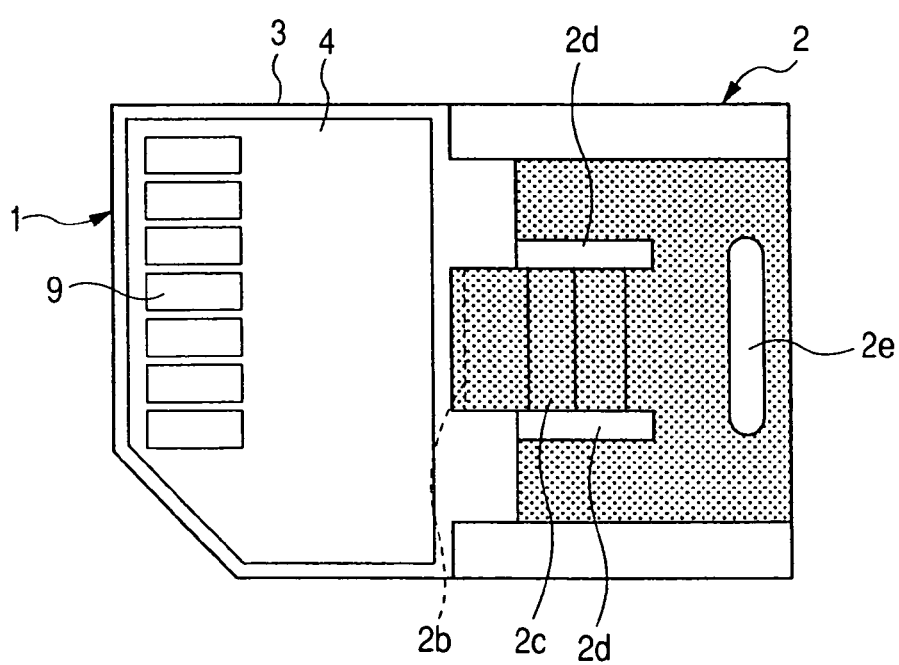

Also in this case, as shown in FIG. 17, it is possible to mount the adapter 2 on the memory card 1 in a neatly arranged state without generating irregularities or drawbacks at the connecting side faces of the memory card 1 and the adapter 2.

This embodiment having such a constitution can also obtain advantageous effects similar to those of the above-mentioned embodiment 1.

EMBODIMENT 3

Figure 18:
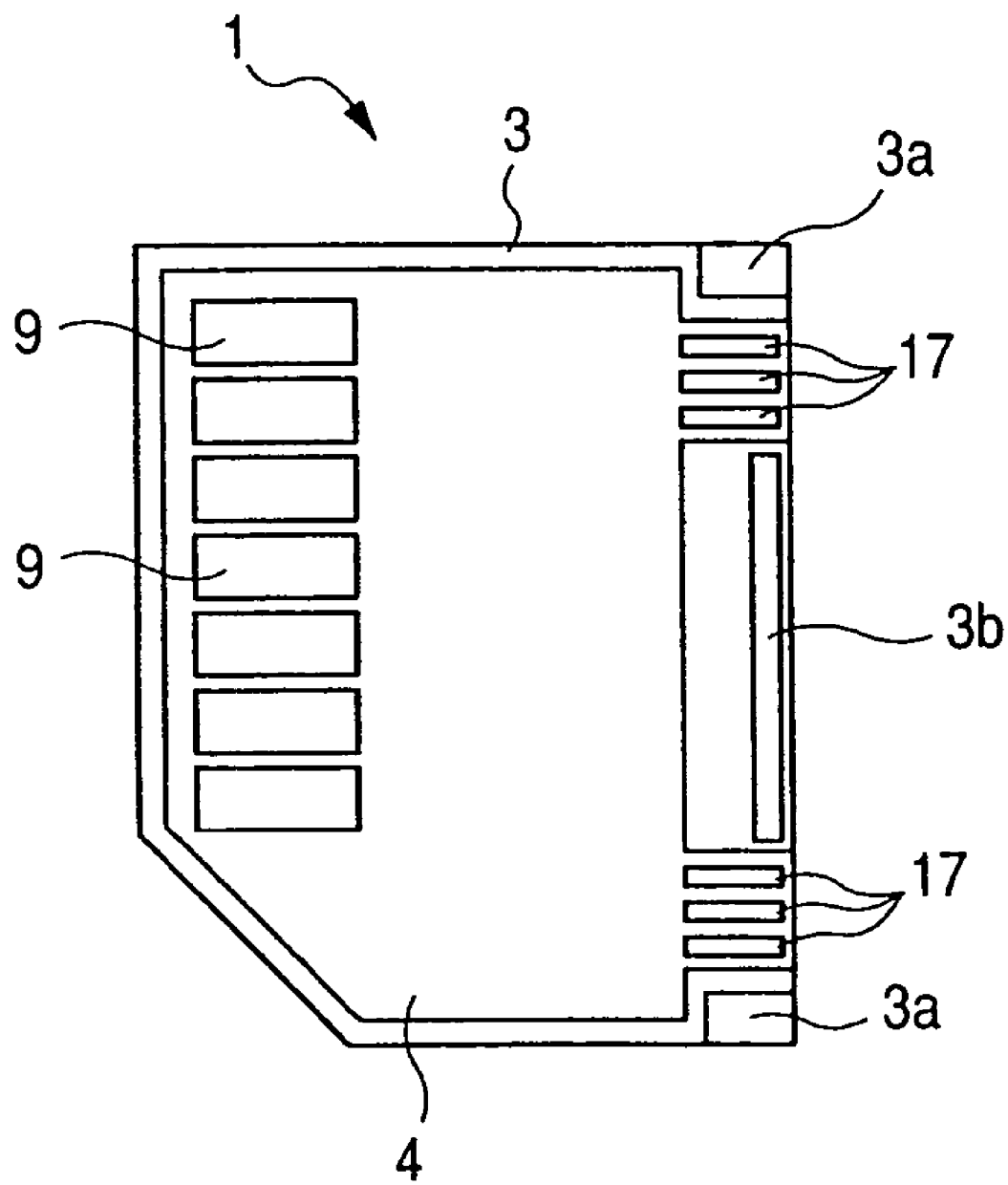
FIG. 18 is a plan view of a rear surface-side of a semiconductor device according to still another embodiment of the present invention.

FIG. 18 is a plan view of a rear surface side of a semiconductor device of still another embodiment of the present invention. In this embodiment, in the vicinity of the adapter mounting portions 3a at a back-face side of the memory card 1, a plurality of connection terminals 17 are regularly arranged in parallel along the longitudinal direction of the memory card 1. The connection terminals 17 are formed on the rear surface side of a base substrate 4 and are electrically connected with a memory circuit formed on the base substrate 4 through wiring on the base substrate 4. These connection terminals 17 constitute terminals for testing the above-mentioned memory circuit or for adding functions.

EMBODIMENT 4

First of all, a drawback that inventors of the present invention have originally found out in a technique which the inventors have studied is explained in conjunction with FIG. 19 to FIG. 23.

Figure 19:
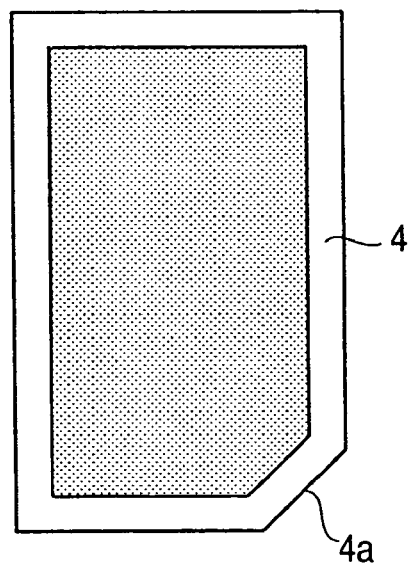
FIG. 19 is a plan view of a surface of a base substrate of a semiconductor device which inventors of the present invention have studied.
Figure 20:
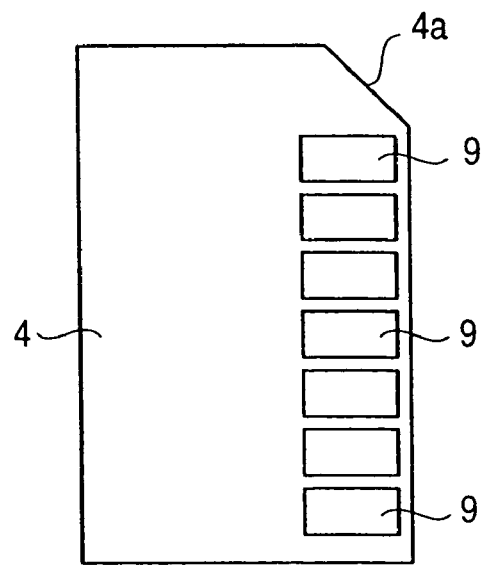
FIG. 20 is a plan view of a rear surface of abase substrate shown in FIG. 19.

FIG. 19 and FIG. 20 respectively show plan views of a front surface (part mounting surface) and a rear surface (external connection terminal forming surface) of the above-mentioned base substrate 4. The base substrate 4 is formed in a rectangular shape in plane and a chamfered portion (third chamfered portion) 4a which eliminates a corner is formed on one corresponding corner portion. The chamfered portion 4a is formed to conform with a chamfered portion for indexing which is formed at a distal end of a front face (mounting end) of the memory card.

Figure 21:
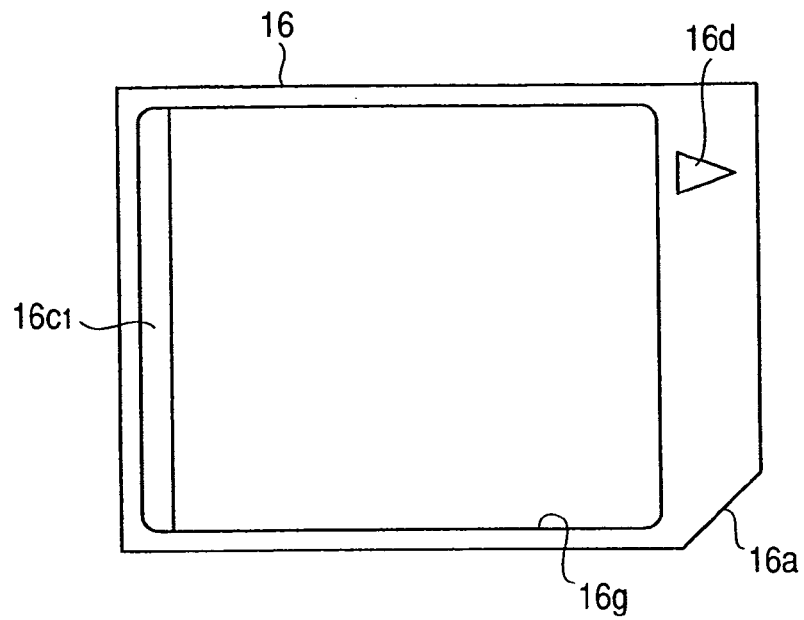
FIG. 21 is a plan view of a surface of a cap for a full-size semiconductor device which inventors of the present invention have studied.
Figure 22:
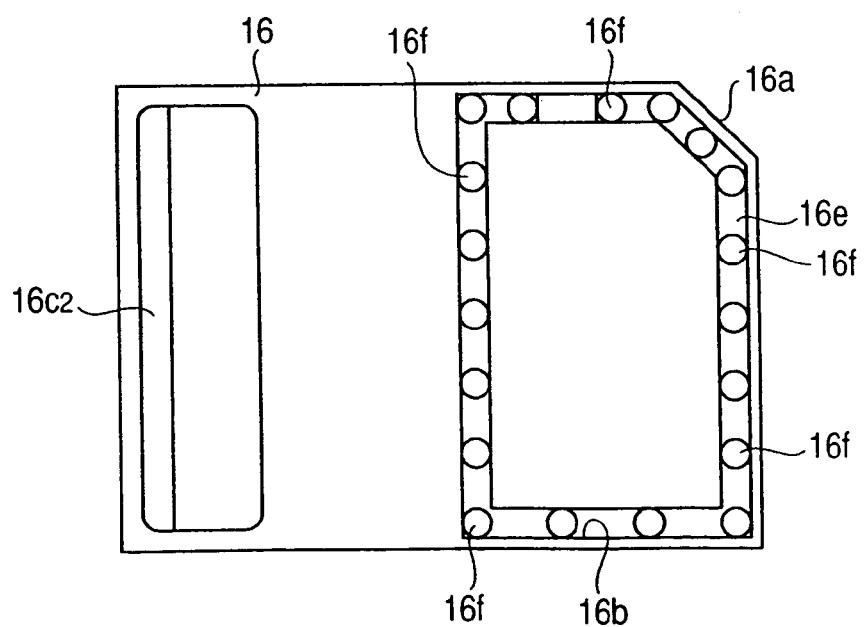
FIG. 22 is a plan view of a rear surface of the cap shown in FIG. 21.

FIG. 21 and FIG. 22 are respectively plan views of a front surface and a rear surface of a cap (a first case body) 16 for the above-mentioned full-size memory card which the inventors have studied. The cap 16 is formed of resin or the like similar to that of the above-mentioned half-size cap 3. In the cap 16, at one front-face side corner portion of the memory card, a chamfered portion (second chamfered portion) 16a for the above-mentioned indexing is formed. This chamfered portion 16a is provided from a viewpoint of facilitating the recognition of the mounting direction of the full-size memory card.

Further, a groove 16b is formed in the rear surface of the cap 16 at the front face side of the memory card. This groove 16b is provided for mounting the base substrate 4 on the cap 16 and is formed such that the groove 16b occupies a region extending from the vicinity of the distal end of the cap 16 to a position slightly ahead of a longitudinally half position of the cap 16. The planar shape and dimensions of the groove 16b are formed such that the planar shape is equal to the planar shape of the base substrate 4 and the planar dimensions are slightly larger than the planar dimensions of the base substrate 4 so as to facilitate the accommodation and fitting of the base substrate 4. Accordingly, in the groove 16b, one corner portion thereof at the front face side of the cap is chamfered along the chamfered portion 16a of the cap 16 thus forming a chamfered portion 16b1. Further, among two long sides of the groove 16b, the long side which is formed at the longitudinally center side of the cap 16 crosses two short sides of the groove 16b at a right angle. Further, within a region of the groove 16b, at an outer periphery, a stepped portion 16e which has a thickness slightly larger than a thickness of the inner side of the groove 16b and is slightly smaller than a thickness of the outside of the groove 16b is formed. A plurality of pin traces 16f which are formed by cutting the stepped portion 16e indicate traces where ejector pins come into contact with when the cap 16 is removed from a mold after molding the cap 16 using the mold.

Further, on the front surface and the back surface of the cap 16, in the vicinity of the back side, card removing grooves 16c1, 16c2 are formed. These card removing grooves 16c1, 16c2 are grooves which perform functions similar to the functions of card removing grooves 3c which have been explained in the previous embodiment 1 (See FIG. 1 and the like). A depth of the rear-surface side groove portion 16c2 is set greater than a depth of the front-surface side card removing groove 16c1. It may be possible to provide only either one of these card removing grooves 16c1, 16c2. Further, on the surface of the cap 16, in the vicinity of the frontal face, a planar triangular mark 16d which indicates the insertion direction when the full-size memory card is mounted in the electronic device is formed. Further, on the most portion of the front surface of the cap 16, a rectangular shallow indentation 16g having round corners in plane is formed. This indentation 16g is provided for laminating a seal or the like on which various information are written in such a manner that the classification of the memory cards is written or the like.

Figure 23:
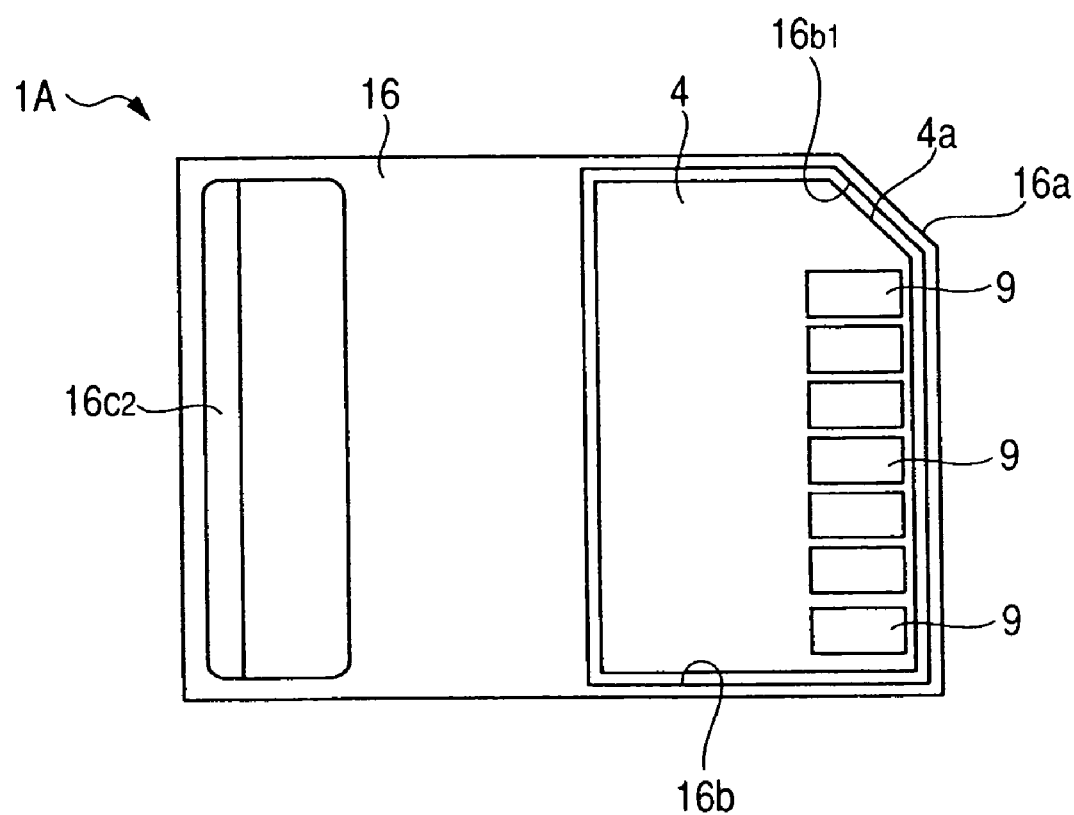
FIG. 23 is a plan view of a rear surface-side of the full-size semiconductor device after the base substrate shown in FIG. 19

FIG. 23 is a plan view of the rear surface-side of the full-size memory card 1A after the base substrate 4 shown in FIG. 19 and FIG. 20 is mounted in the groove 16b of the cap 16 shown in FIGS. 21 and 22. The base substrate 4 is neatly mounted on the region which substantially covers one longitudinal half of the cap 16.

Here, the inventors have carried out the bending rupture strength test with respect to the full-size memory card 1A shown in FIG. 23. The bending rupture strength test is performed as follows, for example. First of all, the memory card 1A is mounted on a test base in a state that the rear surface-side of the memory card 1A faces an upper surface of the test base. Here, support members are interposed between the rear surface-side of the memory card 1A and the upper surface of the test base at two positions in the vicinity of both longitudinal ends of the memory card 1A such that a gap of a given dimension is formed between the rear surface of the memory card 1A and the upper surface of the test base. In this state, by applying a load of a given quantity to the longitudinal center on the front surface of the memory card 1A so as to bend the memory card 1A, the rupture strength of the memory card 1A is evaluated.

As a result of this experiment, the inventors have originally found out that the memory card 1A shown in FIG. 23 suffers from following drawbacks. That is, the memory card 1A shown in FIG. 23 exhibits the lower bending rupture strength compared to the structure of a full-size memory card having a base substrate and a cap whose planar dimensions are approximately equal to those of the memory card 1A and hence, the base substrate 4 is peeled off at a boundary portion (gap portion) between the cap 16 and the base substrate 4 at the center of the rear surface-side of the memory card 1A, or cracks are generated on the cap 16 with portions where a long side which is formed at the longitudinally center side of the cap 16 out of long sides of the groove 16b formed in the cap 16 crosses two short sides of the groove 16b at right angle being as a starting point.

Accordingly, in this embodiment, in the full-size memory card in which the planar dimension of the base substrate occupies approximately one half of the planar dimension of the cap, the structure which can enhance the above-mentioned bending rupture strength is proposed. To be more specific, the structure has a following constitution.

Figure 24:
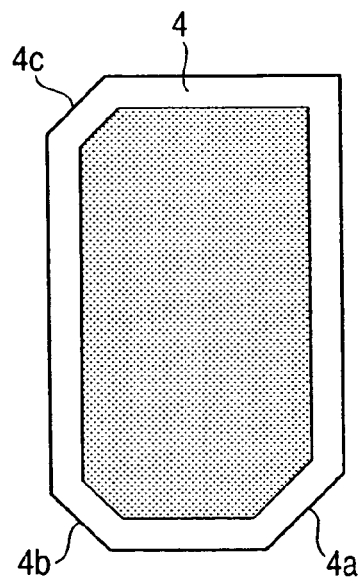
FIG. 24 is a plan view of a front surface of the base substrate which constitutes the semiconductor device according to one embodiment of the present invention.
Figure 25:
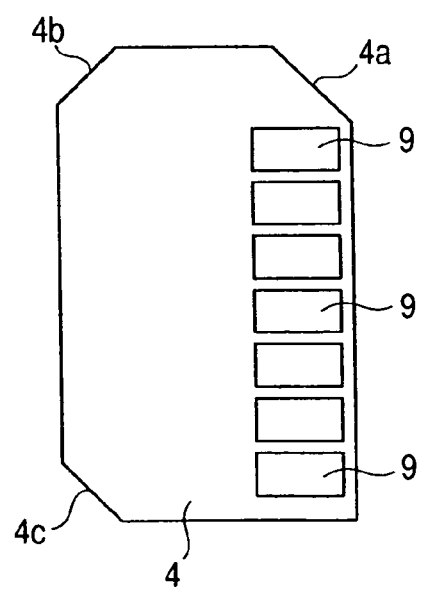
FIG. 25 is a plan view of a rear surface of the base substrate shown in FIG. 24.

FIG. 24 and FIG. 25 are respectively plan views of a front surface (part mounting surface) and a rear surface (external connection terminal forming surface) of the base substrate 4 of the embodiment 4. In the base substrate 4 of this embodiment 4, besides the above-mentioned chamfered portion 4a, corners at two corner corresponding portions are eliminated thus forming chamfered portions (first chamfered portions) 4b, 4c. These chamfered portions 4b, 4c exhibit a chamfered amount smaller than that of the chamfered portion 4a and are formed such that they have the same size and shape to form a left-and-right symmetry. Except for these constitutions, the base substrate 4 of this embodiment 4 has the same constitutions as those explained in conjunction with the above-mentioned embodiment 1, FIG. 19 and FIG. 20 and the like.

Figure 26:
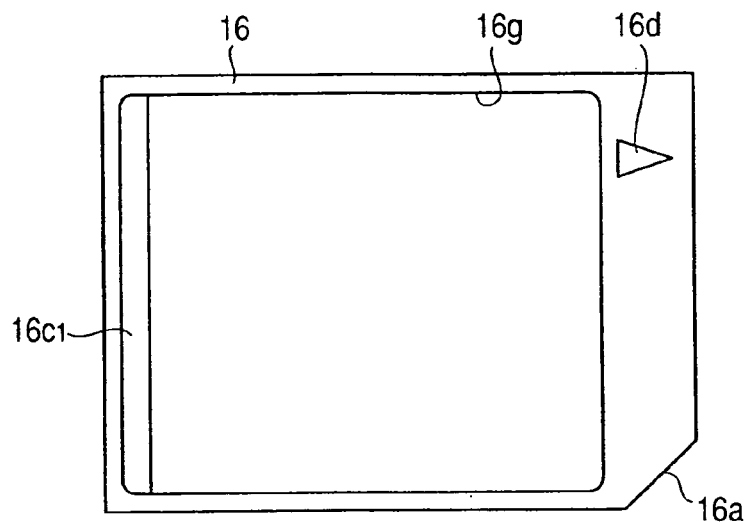
FIG. 26 is a plan view of a front surface of a cap for a full-size semi conductor device which mounts the base substrate shown in FIG. 24 and FIG. 25 thereon.
Figure 27:
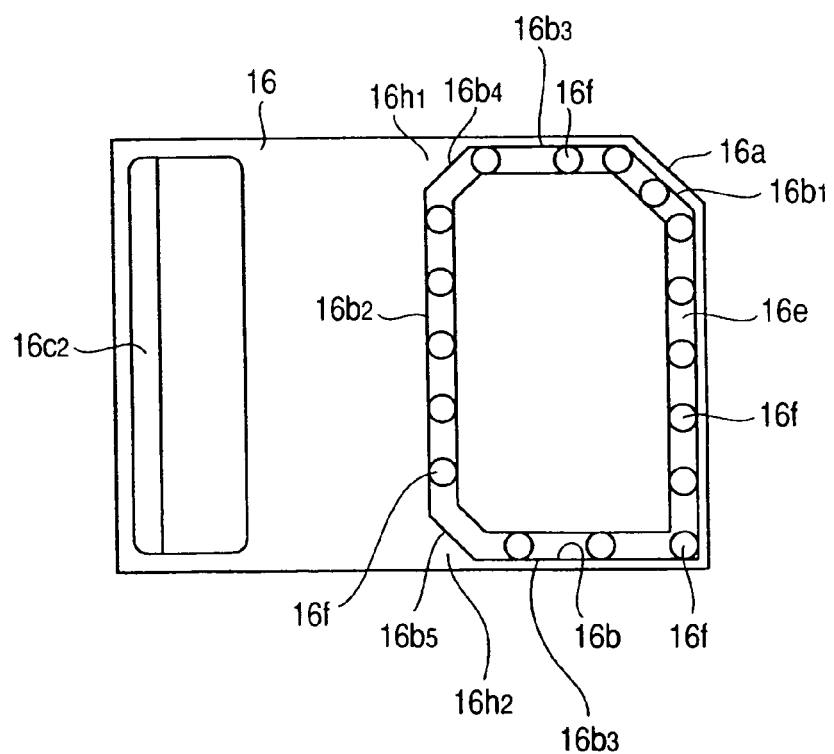
FIG. 27 is a plan view of a rear surface of the cap shown in FIG. 26.

FIG. 26 and FIG. 27 are respectively plan views of a front surface and rear surface (base substrate mounting surface) of a cap 16 for a full-size memory card which mounts the base substrate 4 shown in FIG. 24 and FIG. 25 thereon. The cap 16 of this embodiment 4 differs in the shape of a groove (first groove) 16b which mounts the base substrate 4 therein from the previously-mentioned cap 16. Except for the above constitution, the cap 16 of this embodiment 4 has the same constitution as that of the cap 16 explained in conjunction with the above-mentioned embodiment 1, FIG. 21 and FIG. 22. That is, in this embodiment 4, with respect to the planar shape and dimensions of the groove 16b, to enable the neat fitting of the base substrate 4 shown in FIG. 24 and FIG. 25 into the groove 16b, the groove 16b has the same planar shape as the base substrate 4 and has the planar dimensions which are slightly larger than those of the base substrate 4. Accordingly, with respect to long sides of the groove 16b, the long side 16b2 which is formed at the longitudinally center side of the cap 16 does not cross two short sides 16b3, 16b3 of the groove 16b at a right angle and the portions where the long sides 16b2 and the short sides 16b3 originally cross each other have corners thereof eliminated so that chamfered portions (first chamfered portions) 16b4, 16b5 are formed. That is, the groove 16b is configured such that portions between the long side 16b2 and the short sides 16b3 gradually change crossing angles byway of the chamfered portions 16b4, 16b5 which intercect the long sizes 16b2 and the short sides 16b3 obliquely. Alternatively, the groove 16b is configured such that at two corner portions which are originally formed at the longitudinally center side of the cap 16, reinforcing portions 16h1, 16h2 having a right-angled isosceles triangular shape are arranged in a state that right-angular portions are aligned with two corner portions. These chamfered portions 16b4, 16b5 exhibit a chamfered amount smaller than that of the chamfered portion 16a and have the same size and shape to form a right-and-left symmetry each other.

Figure 28:
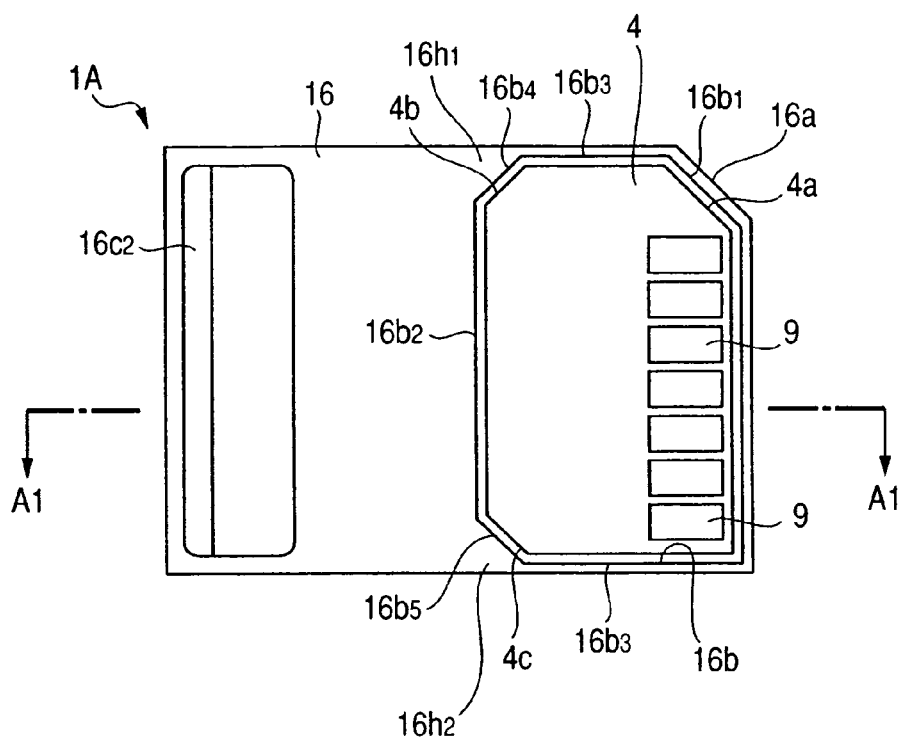
FIG. 28 is a plan view of a rear surface-side of the full-size semiconductor device after the base substrate shown in FIG. 24
Figure 29:
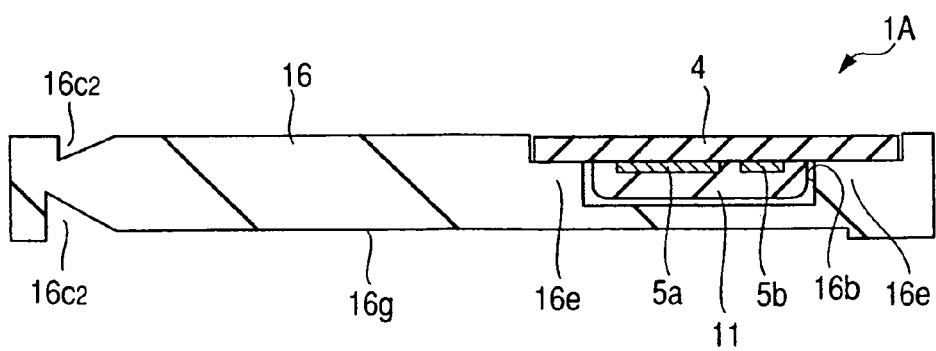
FIG. 29 is a cross-sectional view taken along a line A1-A1 in FIG. 28.

FIG. 28 is a plan view of the rear surface-side of the full-size memory card 1A after the base substrate 4 shown in FIG. 24 and FIG. 25 is mounted on the cap 16 shown in FIG. 26 and FIG. 27, and FIG. 29 indicates a cross-sectional view taken along a line A1-A1 in FIG. 28. In this embodiment 4, the base substrate 4 is mounted in the inside of the groove 16b such that the front surface of the base substrate 4 is directed to the groove 16b side formed on the rear surface of the cap 16 and the chamfered portions 4b, 4c of the base substrate 4 respectively face the chamfered portions 16b4, 16b5 of the groove 16b. The base substrate 4 is supported in a state that the outer peripheral portion of the front surface thereof is brought into contact with the stepped portion 16e in the inside of the groove 16b of the cap 16.

In this embodiment 4, the length of contact between the base substrate 4 and the groove 16b can be set longer than the length of contact in the case illustrated in FIG. 23 and hence, the connecting strength between the base substrate 4 and the cap 16 can be enhanced. Further, since the right-angled portions which are liable to be subjected to stress concentration can be eliminated by providing the chamfered portions 4b, 4c to the base substrate 4 and by providing the chamfered portions 16b4, 16b5 to the groove 16b, it is possible to disperse the stress. Accordingly, in performing the bending rupture strength test, it is possible to prevent or suppress the peeling off of the base substrate 4 and it is also possible to suppress or prevent the occurrence of cracks on the cap 16.

Further, the above-mentioned structure which can enhance the bending rupture strength requires no additional other new members and is a simple structure obtained by only chamfering the corner portions of the base substrate 4 and the corner portions of the groove 16b of the cap 16 whereby the structure can be formed easily. Accordingly, the productivity is not damaged so that this embodiment can provide the highly reliable full-size memory card 1A.

It has been found that the full-size memory card 1A of this embodiment 4 is an effective structure also in an electrostatic rupture test. In this electrostatic rupture test, in a state that the memory card 1A is mounted on a test device, static electricity is applied to the memory card 1A from a back-face side. In the full-size memory card, with respect to the structure in which the base substrate and the cap have the substantially same plane dimensions, the base substrate is formed such that the base substrate extends to a position close to the back-face side of the memory card and hence, the distance of a conductive path from the back-face side of the memory card to the chip at the frontal side is short. On the contrary, the memory card 1A of this embodiment 4 is formed of the insulating cap 16 which extends from the back face thereof to the longitudinally approximately half position and hence, the distance of a conductive path from the back-face side thereof to the frontal face side chip is long where by the full-size memory card 1A exhibits the structure which is difficult to be ruptured by the electrostatic rupture test.

Further, in the full-size memory card 1A, the structure having the planar dimensions of the base substrate set to approximately one half of the planar dimensions of the cap 16 can reduce the area of the base substrate 4 and the volume of the sealing resin 11 compared to the structure in which the base substrate and the full-size cap substantially have the same planar dimensions. Accordingly, it is possible to make the full-size memory card 1A light-weighted. Particularly, since the memory card 1A of the embodiment 4 has, as mentioned above, the corner portions of the base substrate 4 chamfered, the reduction of weight can be enhanced. Accordingly, the portability of the full-size memory card 1A can be enhanced.

Figure 30:
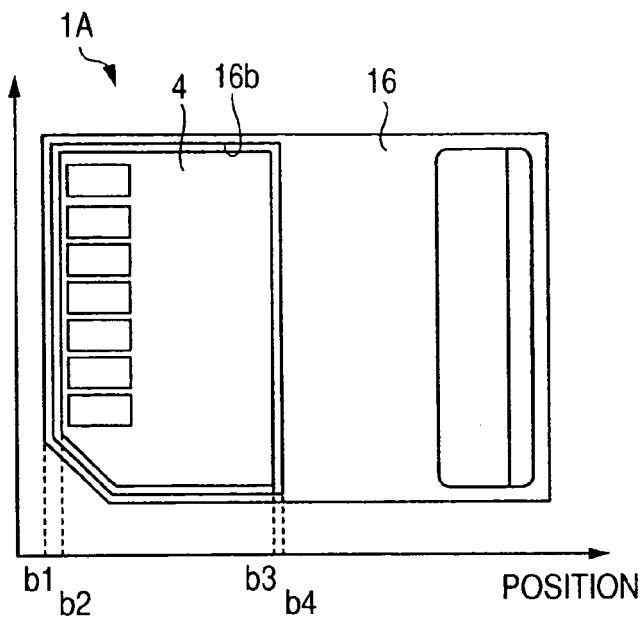
FIG. 30 is an explanatory view of a result of bending rupture strength test of the semiconductor device shown in FIG. 23.
Figure 31:
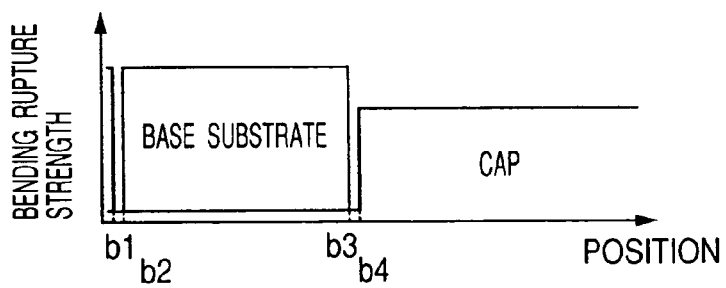
FIG. 31 is an explanatory view of a result of bending rupture strength test of the semiconductor device shown in FIG. 23.
Figure 32:
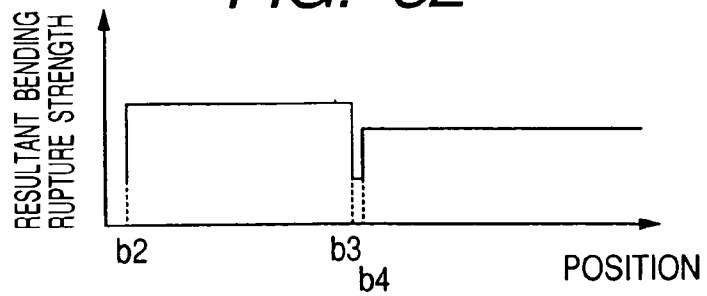
FIG. 32 is an explanatory view of a result of bending rupture strength test of the semiconductor device shown in FIG. 23.

FIG. 30 to FIG. 32 are explanatory views showing the result of bending rupture strength test of the memory card 1A shown in FIG. 23. In the memory card 1A having such a structure, it is understood that the bending rupture strength is dropped sharply and in a rectangular shape at a boundary portion (positions b3, b4) between the base substrate 4 and the cap 16 which is disposed at the approximately longitudinal center of the cap 16. Here, symbols b1 to b4 are given to indicate positions for facilitating the understanding of the positional relationship between them in FIG. 30 to FIG. 32.

Figure 33:
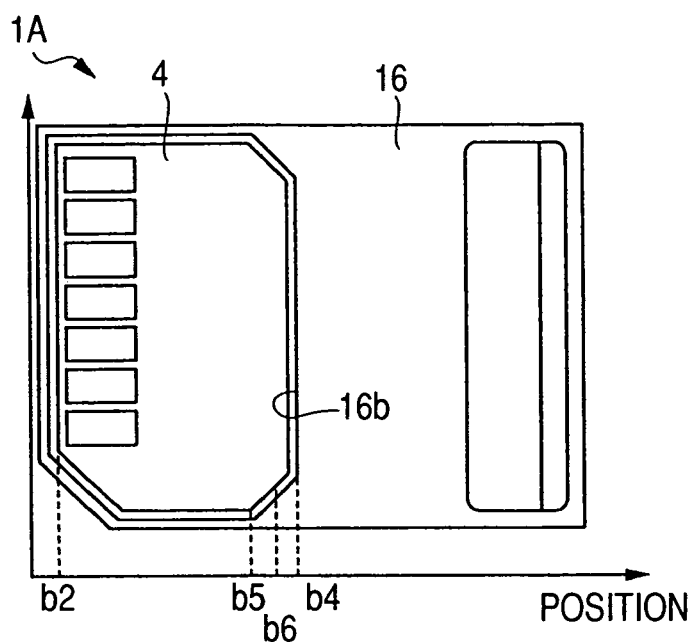
FIG. 33 is an explanatory view of a result of bending rupture strength test of the semiconductor device according to one embodiment of the present invention.
Figure 34:
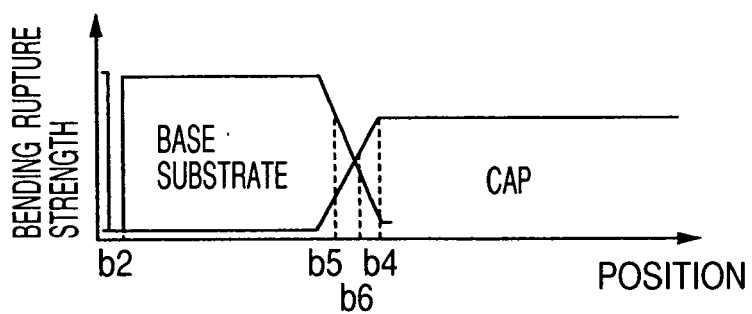
FIG. 34 is an explanatory view of a result of bending rupture strength test of the semiconductor device according to one embodiment of the present invention.
Figure 35:
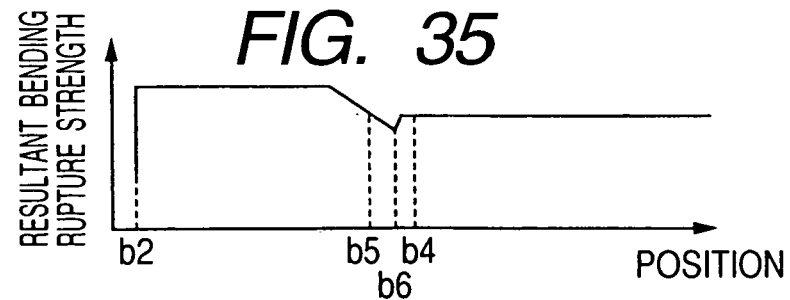
FIG. 35 is an explanatory view of a result of bending rupture strength test of the semiconductor device according to one embodiment of the present invention.

On the other hand, FIG. 33 to FIG. 35 are explanatory views showing the result of bending rupture strength test of the memory card 1A shown in FIG. 28 and the like of this embodiment 4. In the memory card 1A of this embodiment 4, it is understood that the drop of the bending rupture strength at a boundary portion (positions b5, b6, b4) between the base substrate 4 and the cap 16 which is disposed at the approximately longitudinal center of the cap 16 is made relatively gentle and the minimum value is higher than the minimum value in the case of FIG. 31 and FIG. 32. That is, this embodiment 4 can enhance the bending rupture strength of the full-size memory card 1A.

Subsequently, the definition on dimensions and the like of the full-size memory card 1A of this embodiment 4 are explained hereinafter in conjunction with FIG. 36 and FIG. 37.

Figure 36:
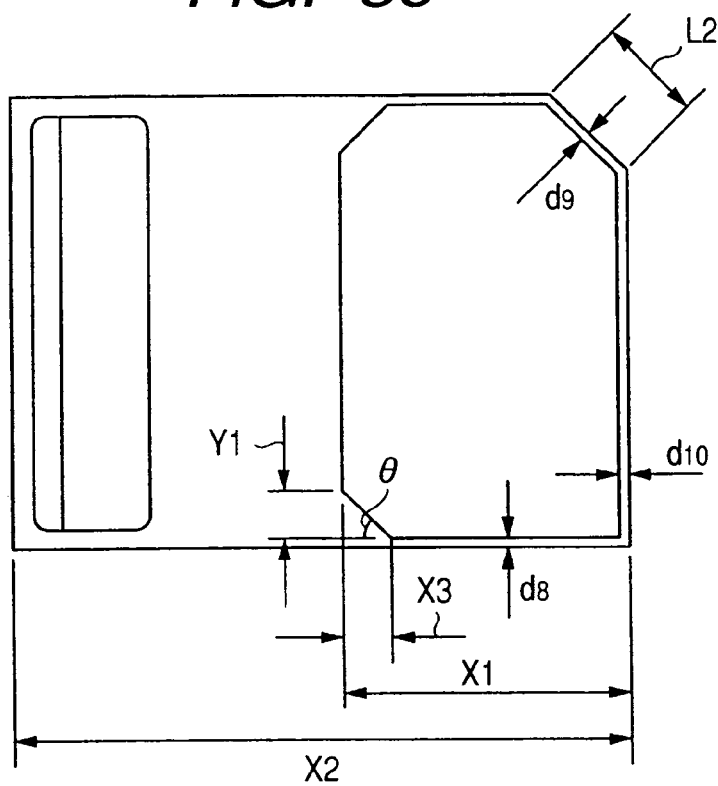
FIG. 36 is a plan view of a rear surface of a cap of the semiconductor device according to one embodiment of the present invention.

FIG. 36 is a plan view of the rear surface of the cap 16 of this embodiment 4. The length in the lateral direction of the groove 16d (that is, substantially the dimension in the lateral direction of the base substrate 4) X1 is set smaller than one half of the total length X2 in the longitudinal direction of the cap 16 (X1<X2/2). This setting is made so as to enable the common use of the base substrate 4 in both of the full-size mode and the half-size mode. That is, when the width X1 is set equal to or longer than one half of the total length X2, the base substrate cannot be used in the half-size memory card 1 which has been explained in conjunction with the above-mentioned embodiment 1. The length X1 is approximately 14.5 mm, for example, and the total length X2 is approximately 32 mm, for example.

Further, in this embodiment 4, at the chamfered portions 16b4, 16b5, the length X3 in the longitudinal direction of the cap 16 is set equal to the length Y1 in the lateral direction of the cap 16 (X3=Y1). Accordingly, an angle θ is set to approximately 45°. This is because this setting can enhance the bending rupture strength at the corner portion regions as a whole theoretically. Further, according to the studies carried out by the inventors, a favorable result was obtained on the bending rupture strength even when the relationship is set to Y1>X3. The lengths X3, Y1 are approximately 2 mm, for example.

Further, the length L2 of the chamfered portion 16a is set longer than the lengths X3, Y1 (L2>X3, Y1). This is because when the lengths X3, Y1 are set excessively large, the area of the base substrate 4 is made excessively small and hence, the chip cannot be mounted on the base substrate 4. The length L2 is set to 5.66 mm, for example.

Further, these lengths X3, Y1 are set larger than the thicknesses d8, d9, d10 (X3, Y1>d8, d9, d10). This is because when the lengths X3, Y1 are set smaller than the thicknesses d8 to d10, a chamfered amount becomes excessively small so that it is difficult to sufficiently obtain the above-mentioned bending rupture strength. The thickness d8 is approximately 1 mm, for example, and the thicknesses d9, d10 are approximately 0.6 mm, for example.

Figure 37:
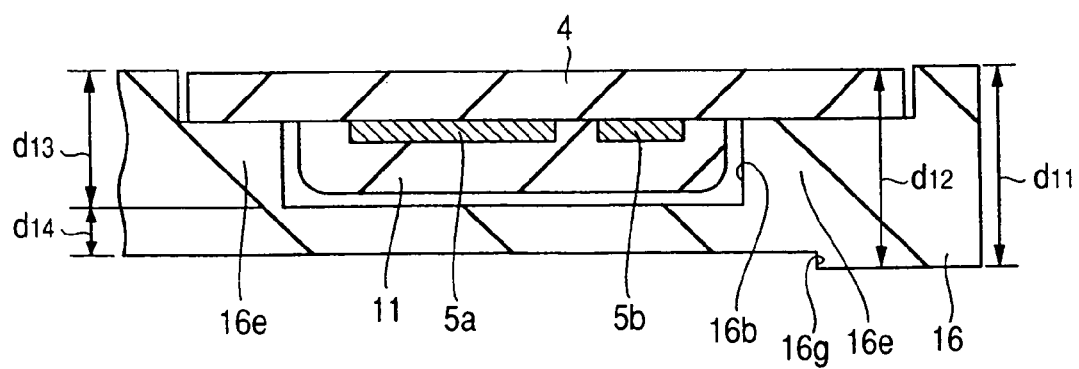
FIG. 37 is an enlarged cross-sectional view of an essential part of the semiconductor device according to one embodiment of the present invention.

Further, FIG. 37 is an enlarged cross-sectional view of an essential part of the memory card 1A of this embodiment 4. The total thickness of the memory card 1A corresponds to the thickness d11 of the cap 16. This thickness d11 is equal to or more than the thickness of d12 (d11≧d12). The thickness d12 is a thickness from the front surface of the cap 16 to the rear surface of the base substrate 4. The reason that the dimension is set in the above-mentioned manner is that when the thickness d12 becomes greater than the thickness d11, the memory card 1A cannot conform with the Standard of the memory card. The depth d13 indicates a depth of the groove 16b. The thickness d11 is approximately 1.4 mm, for example. The thickness d12 is equal to or less than 1.4 mm, for example. The depth d13 is approximately 1.04 mm, for example, and the thickness d14 is approximately 0.28 mm, for example.

Figure 38:
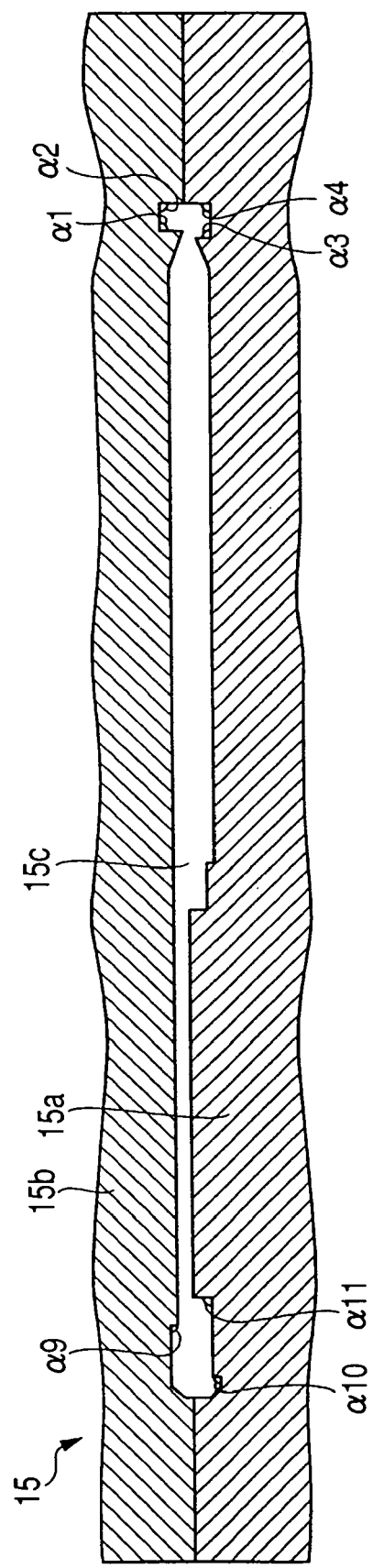

Subsequently, one example of a mold which is used for forming the cap 16 for full-size use shown in FIG. 26 to FIG. 29 and the like is explained in conjunction with FIG. 38. FIG. 38 is a cross-sectional view of the mold 15. The structure of the mold 15 is substantially equal to that which has been explained in conjunction with FIG. 11 and FIGS. 12(a), (c) of the above-mentioned embodiment 1. The difference lies in that the longitudinal length of the cavity 15c is set longer than the longitudinal length of the cavity explained in conjunction with FIG. 15. That is, the length of the portion extending from the approximately longitudinal center of the cavity 15c to a portion where the back face portion of the cap 16 is formed is set longer than the length of the corresponding portion shown in FIG. 11 and FIG. 12.

Figure 39:
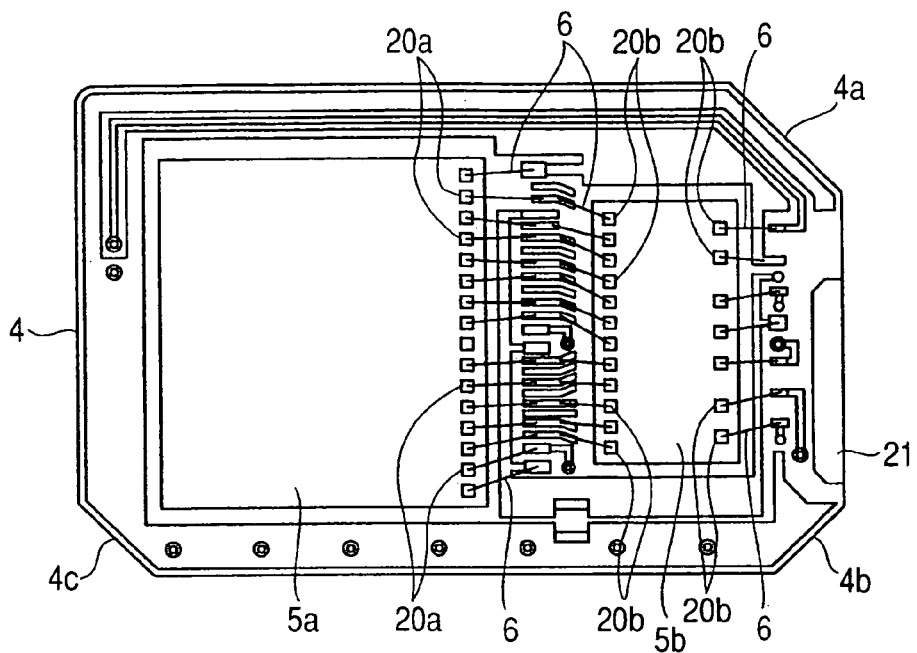
FIG. 39 is a plan view of a front surface of the base substrate illustrating an arrangement example of a chip of the semiconductor device according to one embodiment of the present invention.
Figure 40:
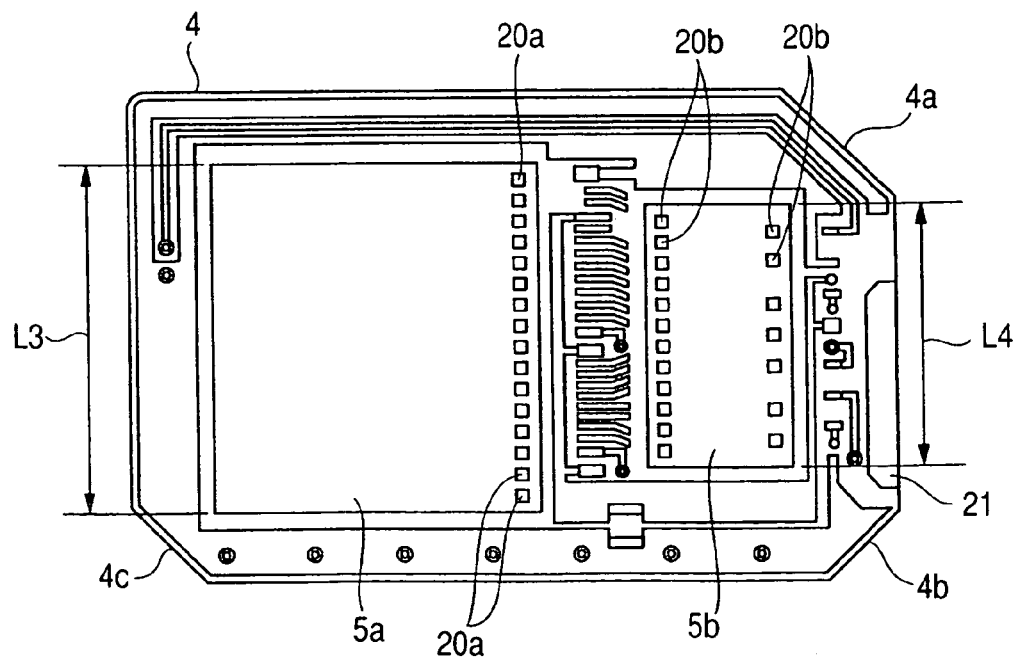
FIG. 40 is a plan view of a front surface of the base substrate illustrating an arrangement example of a chip of the semiconductor device according to one embodiment of the present invention.

Subsequently, an example of layout of the chip on the base substrate 4 of this embodiment 4 is explained in conjunction with FIG. 39 and FIG. 40. FIG. 39 and FIG. 40 are plan views of the front surface (part mounting surface) of the base substrate 4 in this embodiment 4.

In this embodiment 4, on the front surface of the base substrate 4, one chip 5a for memory and one chip 5b for controller are mounted. These chips 5a, 5b are arranged in parallel along the longitudinal direction of the base substrate 4 (that is, the direction along which a plurality of external connection terminals 9 (see FIG. 25 and FIG. 28) are arranged). The relatively large chip 5a for memory is arranged at a position apart from the chamfered portion 4a at the index side. On the other hand, the relatively small chip 5b for controller is arranged at a side close to the chamfered portion 4a at the index side. Due to such an arrangement, it is possible to realize a memory card of large capacity having a compact configuration.

In the above-mentioned chip 5a for memory, a memory circuit of a memory capacity of 16M, 32 bytes, for example, is formed. The chip 5a for memory has a shape closer to square than the chip 5b for controller. The length L3 of one side of the chip 5a for memory is set greater than the length L4 of one side which extends in the longitudinal direction of the chip 5b for controller. In the vicinity of one side on a main surface of the chip 5a for memory, a plurality of bonding pads 20a are arranged along this one side. The chip 5a for memory is mounted such that one side on which a plurality of bonding pads 20a are arranged is arranged at longitudinally center side of the base substrate 4, that is, at the side of the chip 5b for controller. These bonding pads 20a are electrically connected with wiring on the front surface of the base substrate 4 through bonding wires 6.

On the other hand, on a main surface of the chip 5b for controller, in the vicinity of two long sides, a plurality of bonding pads 20b are arranged along these long sides. The chip 5b for controller is mounted on the front surface of the base substrate 4 such that the long sides thereof are arranged substantially parallel to one side along which a plurality of bonding pads 20a of the chip 5a for memory are arranged. These bonding pads 20b are electrically connected to wiring on the front surface of the base substrate 4 through the bonding wires 6. Such an arrangement of the chips 5a, 5b is also applicable to the above-mentioned embodiments 1 to 3.

A metal layer 21 formed of gold plating or the like is formed on the front surface of the base substrate 4 at a longitudinal distal end side (at a side where the chamfered portion 4a is formed). The metal layer 21 constitutes a portion where a gate of a mold is arranged at the time of sealing the chips 5a, 5b. That is, in forming the sealing resin 11 (See FIG. 29 and the like), resin is made to flow toward the region where the chip 5a for memory is arranged through the region where the chip 5b for controller is arranged from the metal layer 21 side.

Subsequently, one example of an assembling method of the semiconductor device of this embodiment 4 is explained. The assembling steps are equal to the steps which have been explained in conjunction with FIG. 13 which shows the previous embodiment 1. Here, the assembling steps are explained in conjunction with FIG. 42 to FIG. 46 along a flow chart shown in FIG. 41. Here, FIG. 42 to FIG. 46 are plan views of the front surface of the base substrate 4 during the assembling steps.

Figure 41:
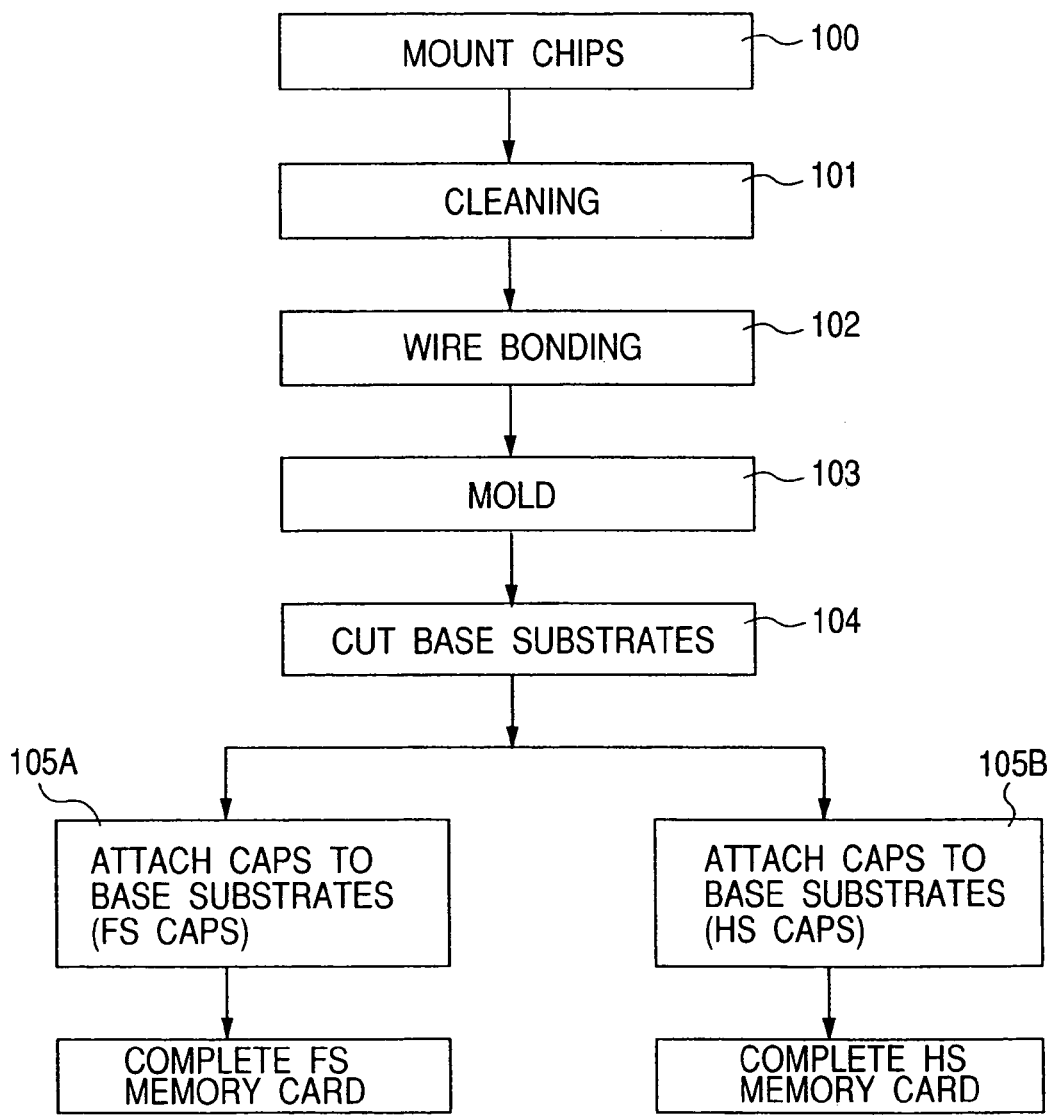
FIG. 41 is a flow chart of assembling steps of the semiconductor device according to one embodiment of the present invention.
Figure 42:
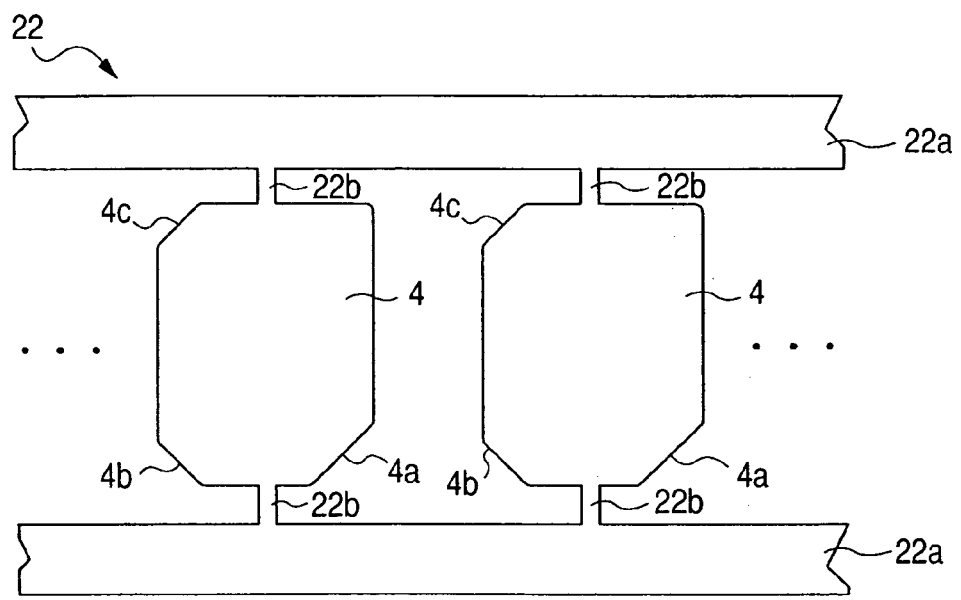
FIG. 42 is a plan view of the front surface of the base substrate during an assembling step of the semiconductor device shown in FIG. 41.
Figure 43:
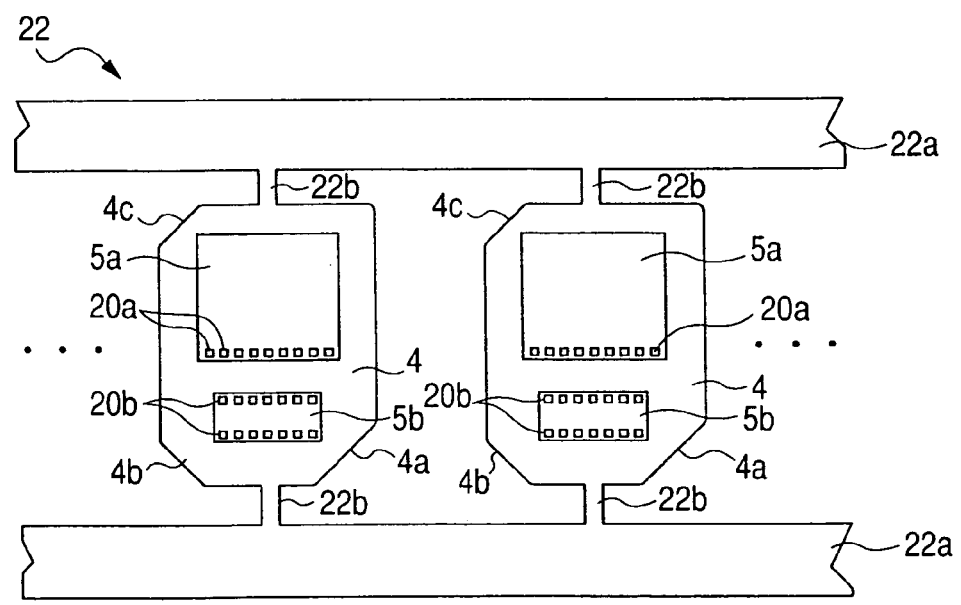
FIG. 43 is a plan view of the front surface of the base substrate during an assembling step of the semiconductor device succeeding the assembling step shown in FIG. 42.

First of all, a base substrate forming body 22 shown in FIG. 42 is prepared. A plurality of base substrates 4 are already connected to a frame body 22a of the base substrate forming body 22 by way of minute connecting portions 22b which are connected to two short-side centers of respective base substrates 4. At this stage, the frame body 22a, the connecting portions 22b and the base substrates 4 are integrally formed. Further, the chamfered portions 4b, 4c of the base substrate 4 are already formed. Subsequently, as shown in FIG. 43, the chip 5a, 5b are mounted on the front surface of each base substrate 4 of the base substrate forming body 22 (step 100 in FIG. 41). Here, the relatively large chip 5a for memory is mounted at a position apart from the chamfered portion 4a and the relatively small chip 5b for controller is mounted at a position close to the chamfered portion 4a. Thereafter, to clean surfaces of the wiring and electrodes (including bonding pads 20a, 20b) of the base substrates 4 and the chips 5a, 5b, the plasma cleaning treatment is applied, for example (step 101 of FIG. 41). The main purpose of this step lies in that by cleaning the front surfaces of the gold plating layer which is thinly formed, the favorable connection state of the wires and metal plating layer is achieved in a bonding wire step which follows this step.

Figure 44:
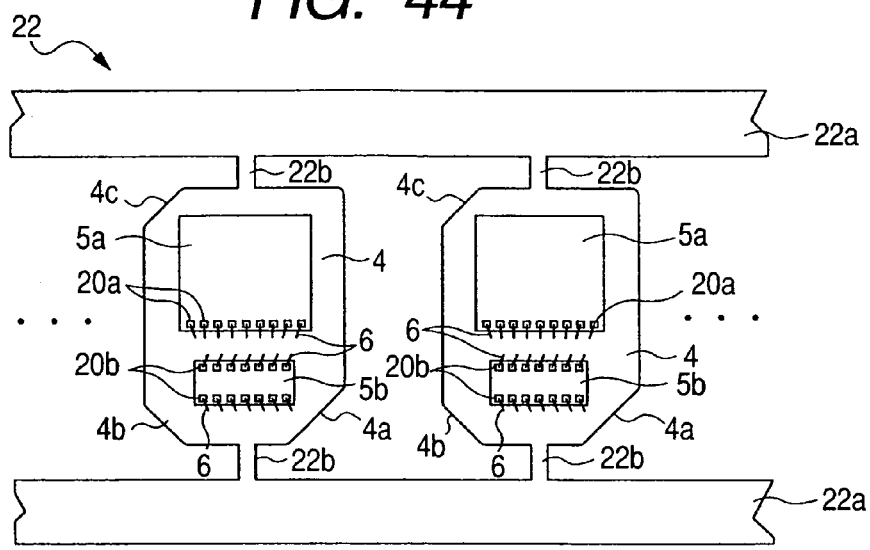
FIG. 44 is a plan view of the front surface of the base substrate during an assembling step of the semiconductor device succeeding the assembling step shown in FIG. 43.
Figure 45:
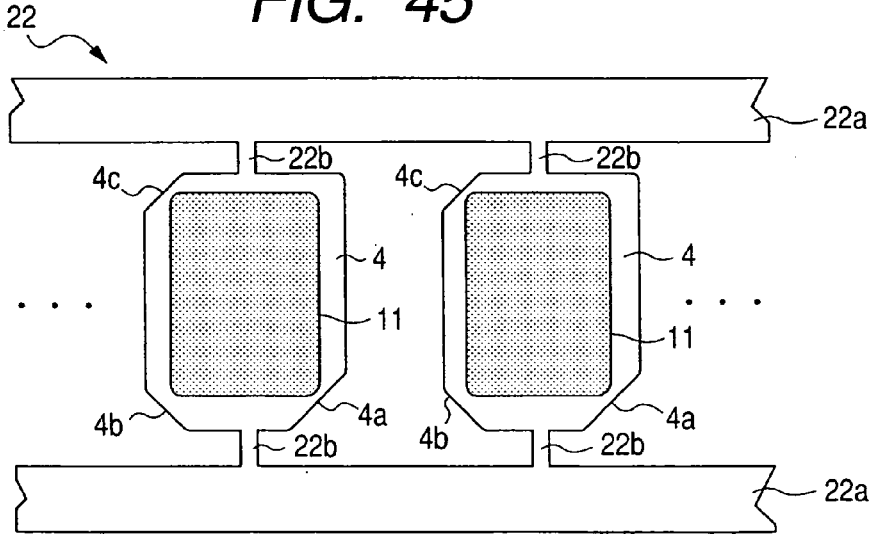
FIG. 45 is a plan view of the front surface of the base substrate during an assembling step of the semiconductor device succeeding the assembling step shown in FIG. 44.
Figure 46:
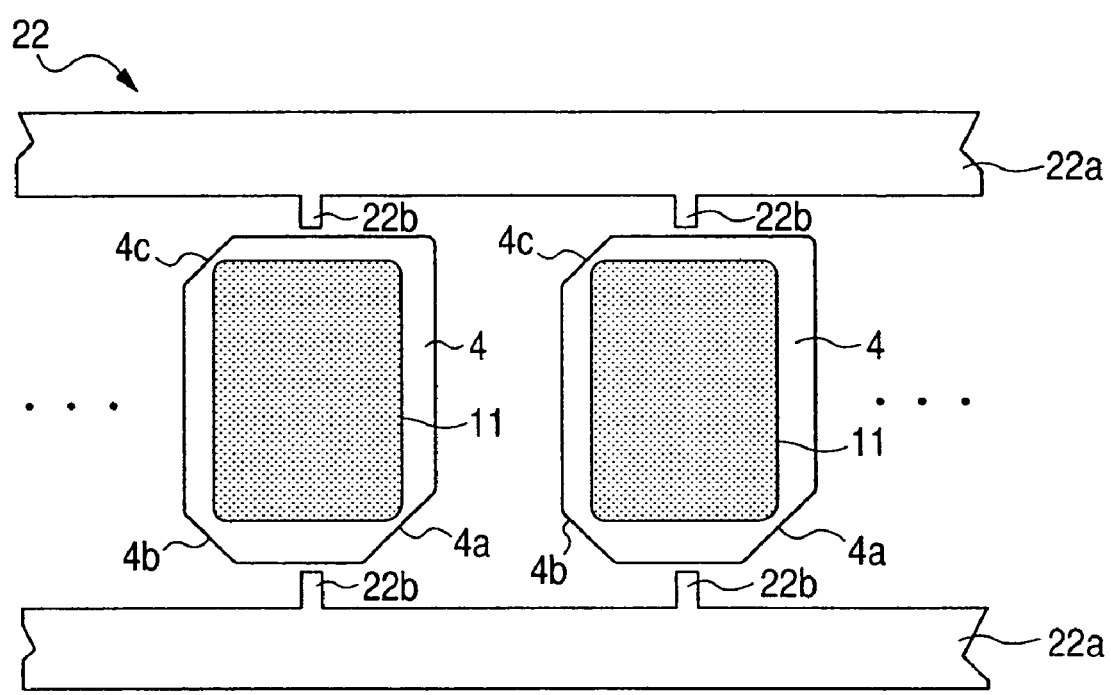
FIG. 46 is a plan view of the front surface of the base substrate during an assembling step of the semiconductor device succeeding the assembling step shown in FIG. 45.

Subsequently, as shown in FIG. 44, on each base substrate 4, the bonding pads 20a, 20b of the chips 5a, 5b are electrically connected to the wiring and the electrodes of the base substrate 4 through the bonding wires 6 (step 102 in FIG. 41). Then, as shown in FIG. 45, in each base substrate 4, the chips 5a, 5b and the bonding wires 6 and the like are sealed using a transfer mold (step 103 in FIG. 41). After completion of the above mentioned wire bonding step and before starting a molding step, the above-mentioned cleaning treatment may be applied to the base substrate 4 from a viewpoint of enhancement of the adhesive property of the sealing resin 11. Thereafter, as shown in FIG. 46, the connecting portions 22b are cut so that the base substrates 4 are separated from the base substrate forming body 22 (step 104 in FIG. 41). In this manner, the base substrates 4 are formed.

Then, in manufacturing the full-size (FS) memory card 1A, the above-mentioned base substrate 4 is mounted in the inside of the groove 16 of the cap 16 shown in FIG. 26 and FIG. 27 and is fixed thereto using an adhesive agent or the like (step 105A in FIG. 41). On the other hand, in manufacturing the half-size (HS) (or reduced size (RS)) memory card 1, the base substrate 4 is mounted in the inside of the groove formed on the rear surface of the cap 3 which is explained in conjunction with FIG. 1 to FIG. 5 and the like of the previously mentioned embodiment 1 (the planar shape of such a groove being formed in the shape explained in conjunction with FIG. 27 to FIG. 29) and is fixed thereto by an adhesive agent or the like (step 105B in FIG. 41).

In this manner, according to this embodiment, two types of memory cards 1, 1A of full size and half size can be manufactured using one base substrate 4. That is, the manufacturing steps and members for the full-size and half-size memory cards 1, 1A can be partially used in common and hence, the manufacturing steps can be simplified and the manufacturing time is shortened and the manufacturing cost can be reduced compared to a case in which the memory cards 1, 1A are separately manufactured.

EMBODIMENT 5

In this embodiment 5, in a full-size memory card in which the planar dimensions of the base substrate is set approximately one half of the planar dimensions of the cap, a modification having a structure which can enhance the above-mentioned bending rupture strength is explained.

Figure 47:
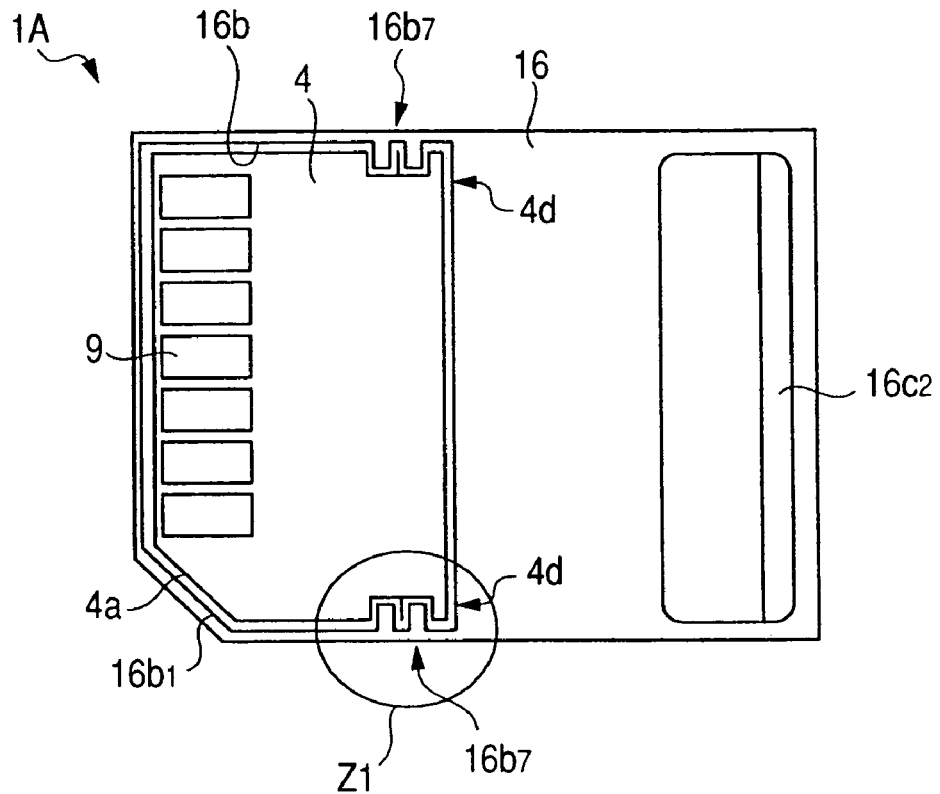
FIG. 47 is a plan view of a rear surface-side of a full-size semiconductor device of another embodiment of the present invention.
Figure 48:
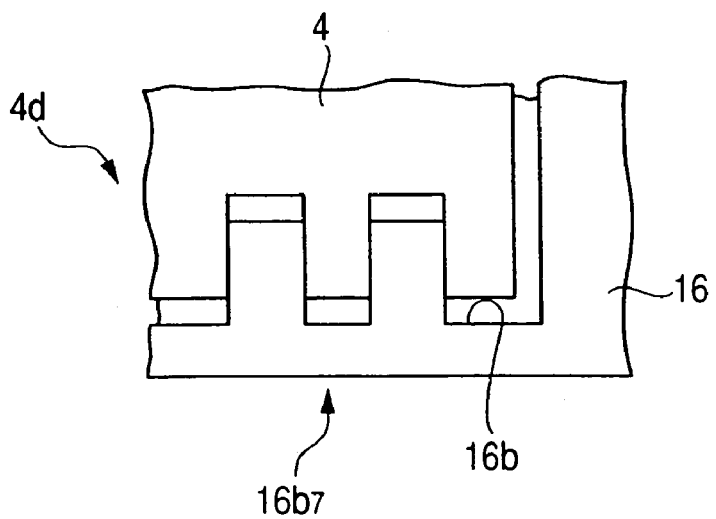
FIG. 48 is an enlarged plan view of a zone Z1 shown in FIG. 47.

FIG. 47 is a plan view of a rear surface-side in the full-size memory card 1A of this embodiment 5 and FIG. 48 is an enlarged plan view of a region Z1 in FIG. 47. In this embodiment 5, on the base substrate 4, minute indentations and projections 4d having a rectangular shape are formed in the vicinity of both corner portions positioned at the longitudinal center side of the full-size cap 16, while minute indentations and projections 16b7 having a rectangular shape are also formed in the vicinity of corner portions of the groove 16b of the cap 16 correspondingly such that these indentations and projections 16b7 can be snuggly fitted into the minute indentations and projections of the base substrate 4. These minute indentations and projections 4b, 16b7 are formed to have a left-and-right symmetry in FIG. 47. Except for the above-mentioned constitutions, the other constitutions of this embodiment are equal to those which have been explained in conjunction with the above-mentioned embodiments 1 to 4. The above-mentioned indentations and projections 4d, 16b7 may be formed on the long side 16b2 of the groove 16b and the long side of the base substrate 4 corresponding to the long side 16b2 of the groove 16b.

Also in this embodiment 5, it is possible to increase the contact area between the base substrate 4 and the cap 16 at the corner portions which exhibit relatively weak strength and hence, the occurrence of cracks on the cap 16 and the peeling-off of the base substrate 4 can be suppressed or prevented so that the above-mentioned bending rupture strength can be enhanced.

EMBODIMENT 6

In this embodiment 6, in a full-size memory card in which the planar dimensions of the base substrate are set approximately one half of the planar dimensions of the cap, another modification having a structure which can enhance the above-mentioned bending rupture strength is explained.

Figure 49:
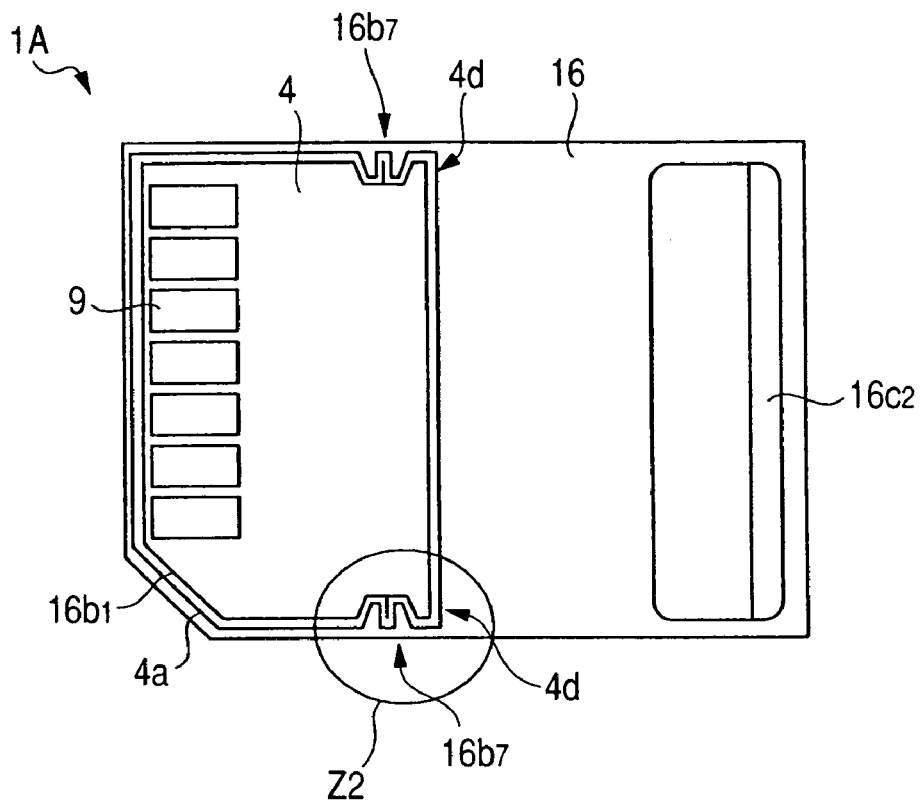
FIG. 49 is a plan view of a rear surface-side of a full-size semiconductor device of another embodiment of the present invention.
Figure 50:
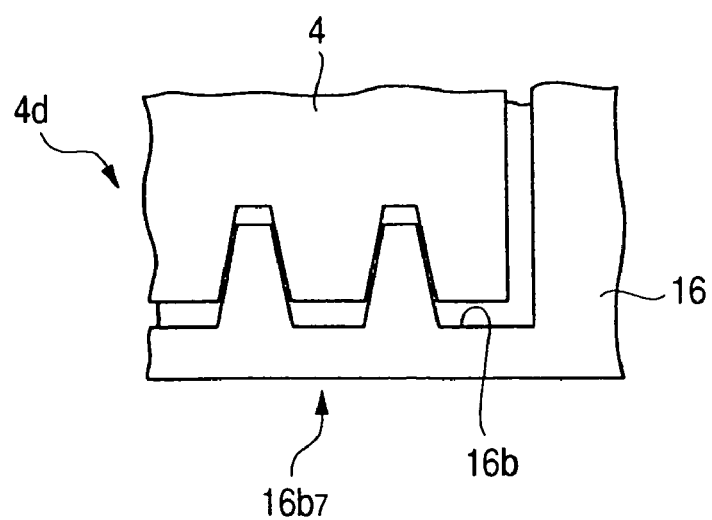
FIG. 50 is an enlarged plan view of a zone Z2 shown in FIG. 49.

FIG. 49 is a plan view of a back surface-side of a full-size memory card 1A of this embodiment 6 and FIG. 50 is an enlarged plan view of a region Z2 in FIG. 49. Also in this embodiment 6, in the same manner as the above-mentioned embodiment 5, in the vicinity of corner portions of the base substrate 4 and in the vicinity of corner portions of a groove 16b of a cap 16 corresponding to the base substrate 4, minute indentations and projections 4d, 16b7 are formed. The difference between this embodiment 6 and the above-mentioned embodiment 5 lies in that side faces of respective minute indentations and projections 4d, 16b7 are tapered. In this case, the fitting engagement between the minute indentations and projections 4d of the base substrate 4 and the minute indentations and projections 4d of the groove 16b of the cap 16 is facilitated compared to the case explained in conjunction with the above-mentioned embodiment 5. Except for the above-mentioned constitutions, the other constitutions of this embodiment are equal to those which have been explained in conjunction with the above-mentioned embodiments 1 to 4. The above-mentioned indentations and projections 4d, 16b7 may be formed on the long side 16b2 of the groove 16b and the long side of the base substrate 4 corresponding to the long side 16b2 of the groove 16b.

EMBODIMENT 7

In this embodiment 7, in a full-size memory card in which the planar dimensions of the base substrate are set approximately one half of the planar dimensions of the cap, still another modification having a structure which can enhance the above-mentioned bending rupture strength is explained.

Figure 51:
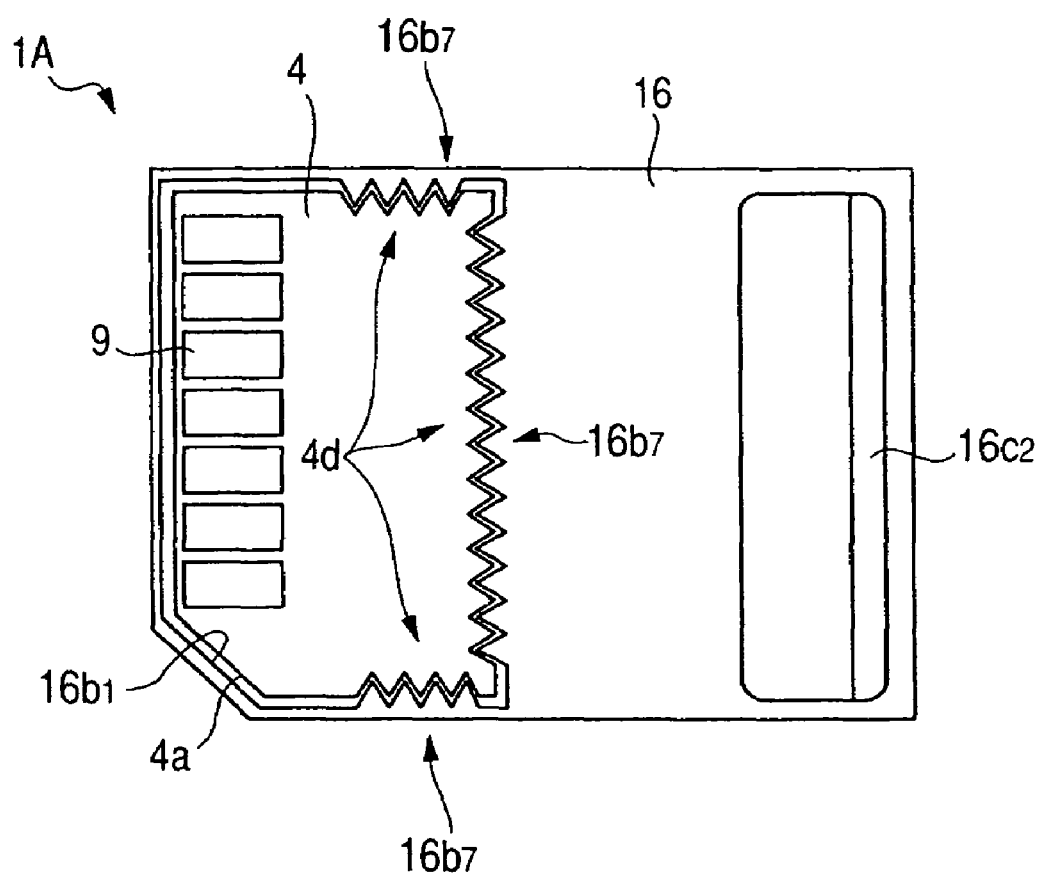
FIG. 51 is a plan view of a rear surface-side of a full-size semiconductor device of another embodiment of the present invention.

FIG. 51 is a plan view of a back surface-side of a full-size memory card 1A of this embodiment 7. With respect to this embodiment 7, on the base substrate 4, along a long side which is positioned at the longitudinally center side of the full-size cap 16 and in the vicinity of both corner portions of lateral sides which cross the long side at a right angle, minute indentations and projections 4d in a serrated shape are formed, while minute indentations and projections 16b7 having a serrated shape are formed along a long side and short sides of a groove 16b of a cap 16 corresponding to the minute indentations and projections 4d such that the minute indentations and projections 4d, 16b7 can be snuggly fitted into each other. Except for the above-mentioned constitutions, the other constitutions of this embodiment are equal to those which have been explained in conjunction with the above-mentioned embodiments 1 to 4. Also in this embodiment 7, it is possible to obtain an advantageous effect with respect to the bending rupture strength similar to the advantageous effects obtained by the above-mentioned embodiments 4 to 6.

EMBODIMENT 8

In this embodiment 8, a half-size memory card which uses the base substrate shown in the previous embodiment 4 in conjunction with FIG. 24 and FIG. 25 and the like is explained.

Figure 52:
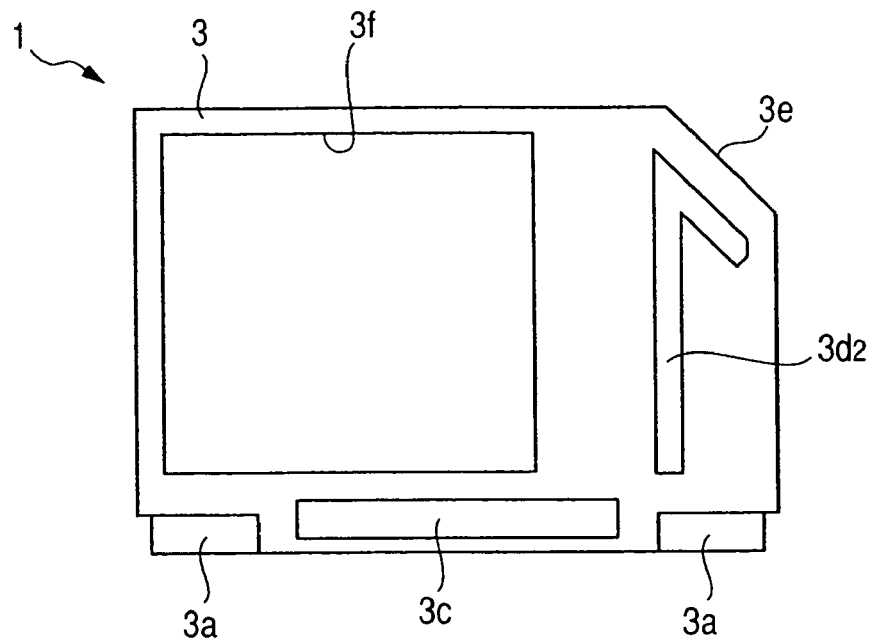
FIG. 52 is a plan view of a front surface-side of a half-size semiconductor device of another embodiment of the present invention.
Figure 53:
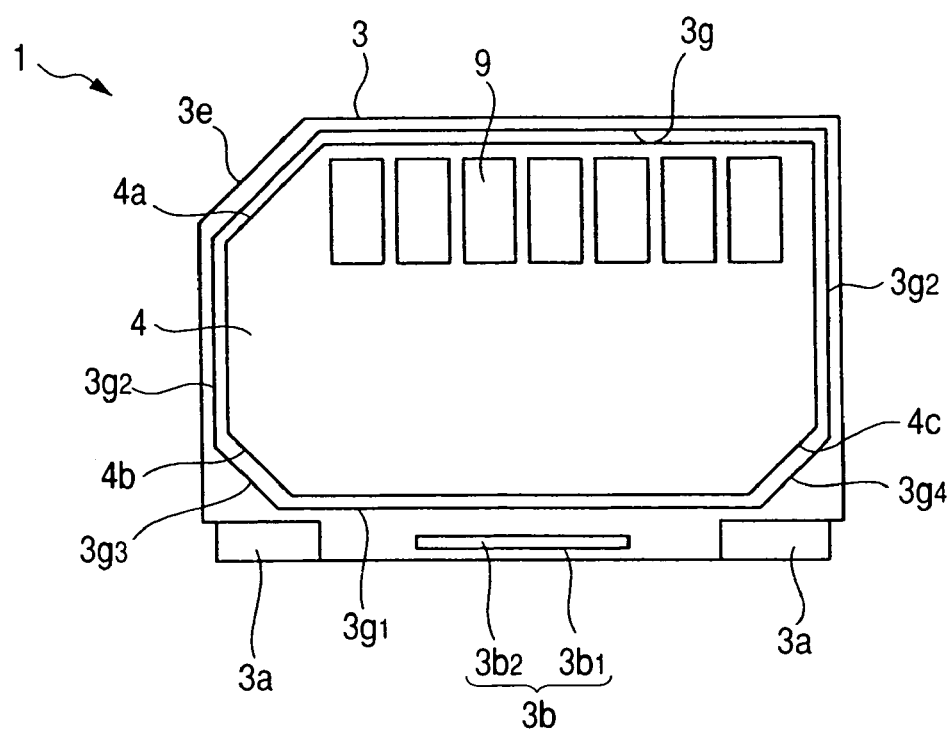
FIG. 53 is a plan view of a rear surface-side of the semiconductor device shown in FIG. 52.

FIG. 52 and FIG. 53 respectively show plan views of a front surface-side and a rear surface-side of the half-size memory card 1 of this embodiment 8. At a frontal face of a cap (second case body) 3 of the memory card 1, a corner of one corner portion is eliminated thus forming the above-mentioned chamfered portion 3e at the index side. This chamfered portion 3e is provided from a viewpoint of facilitating the recognition of the mounting direction of the memory card 1 and the like. Further, on the front surface of the cap 3, at the chamfered portion 3e side, a mark 3d2 having an arrow shape which extends from a back face to the frontal face of the memory card 1 is formed. This mark 3d2 indicates the inserting direction when the memory card 1 is inserted into the above-mentioned electronic device. With respect to the half-size memory card 1 of this embodiment 8, the memory card 1 is inserted into the electronic device using a distal end thereof in the lateral direction as the frontal face. However, in general, there exists a fixed or stereotyped idea that the memory card is inserted into the electronic device using a distal end in the longitudinal direction as a frontal face. Accordingly, to prevent an erroneous insertion, the relatively large mark 3d2 is displayed on the memory card 1. Further, a shallow groove 3f having a planar quadrangular shape is formed on the front surface of the cap 3 in a region apart from the chamfered portion 3e. This shallow groove 3f constitutes a region to which a seal which describes the content of recorded data of the memory card 1 or the like is laminated.

Further, on the rear surface of the cap 3 of this embodiment 8, a groove (second groove) 3g having a planar shape equal to that of the base substrate 4 and a planar dimensions which are slightly larger than the base substrate 4 is formed to enable the neat fitting of the base substrate 4 shown in FIG. 24 and FIG. 25 into the groove 3g (second groove). Accordingly, with respect to the groove 3g in this case, a long side 3g1 at a side in the vicinity of the back-face of the memory card 1 and two lateral sides 3g2, 3g2 of the groove 3g do not cross each other at a right angle and the portions where the long side 3g1 and the short sides 3g2, 3g2 originally cross each other have corners thereof eliminated so that the chamfered portions (first chamfered portions) 3g3, 3g4 are formed. The structure (including the chamfered portions 3g3, 3g4) of this groove 3g is equal to the structure of the groove 16b of the full-size cap 16 which has been explained in the above-mentioned embodiment 4. Due to such a constitution, the base substrate 4 is applicable to both of the full-size memory card and the half size memory card. Further, the mounting state of the base substrate 4 on the groove 3g is equal to the corresponding mounting state which is explained in conjunction with the above-mentioned embodiment 4. Further, the above-mentioned groove portion 3b2 formed on the rear surface of the cap 3 also functions as a catching or hooking groove when the memory card 1 is removed from the electronic device.

EMBODIMENT 9

In this embodiment 9, an example which can cope with a case in which the number of external connection terminals 9 formed on a back surface of a memory card is changed due to the change of the Standard of memory card is explained.

Figure 54:
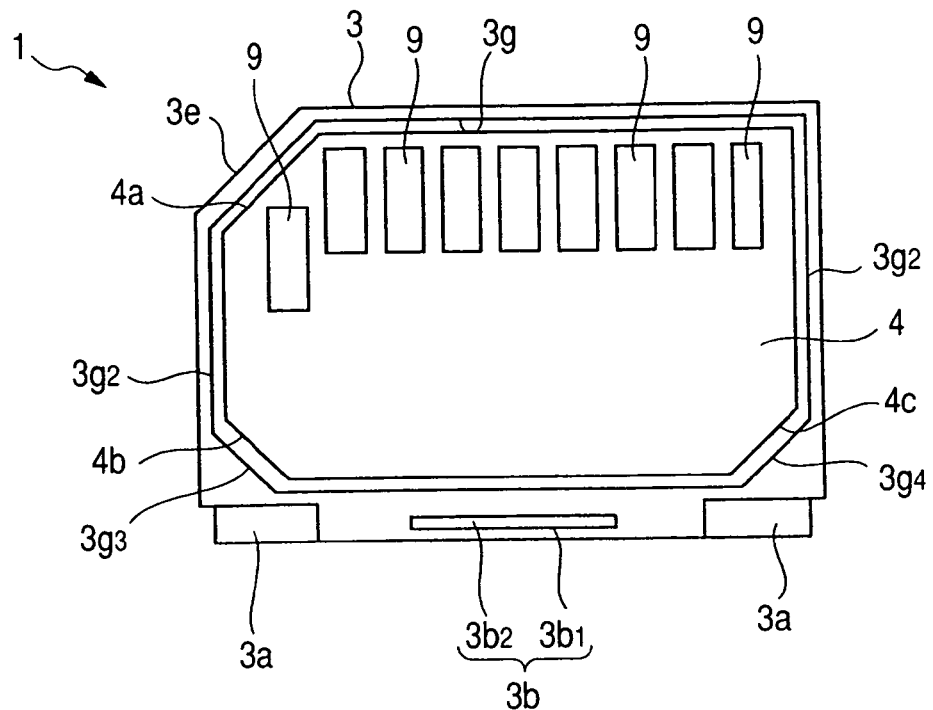
FIG. 54 is a plan view of a rear surface-side of a half-size semiconductor device of another embodiment of the present invention.
Figure 55:
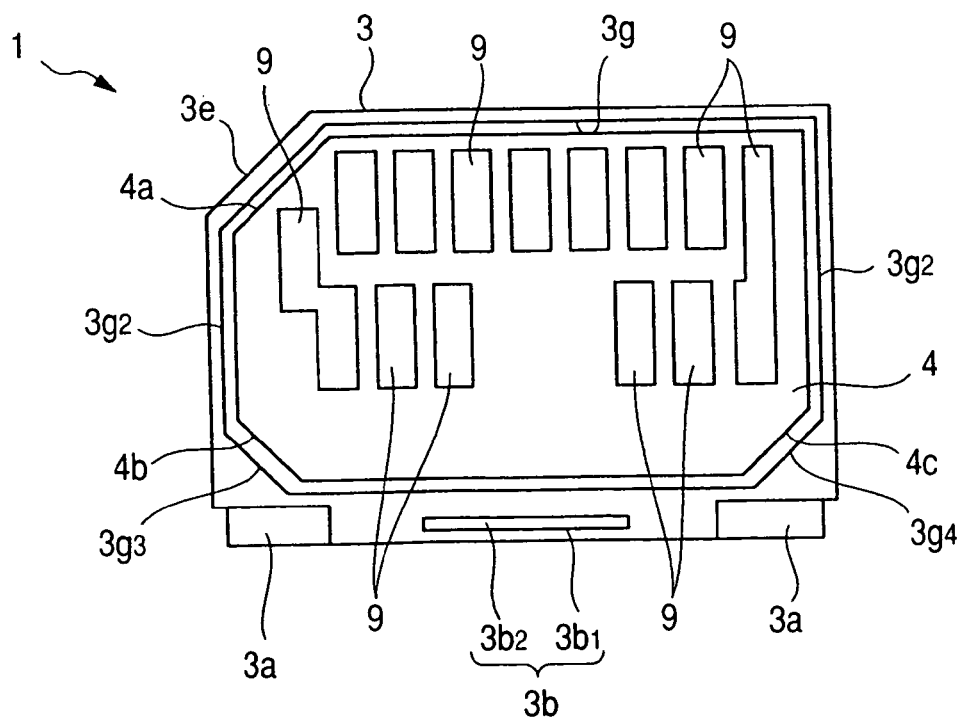
FIG. 55 is a plan view of a rear surface-side of a half-size semiconductor device of still another embodiment of the present invention.

FIG. 54 illustrates a case in which the number of external connection terminals in the memory card 1 of this embodiment 9 is registered with the number of external connection terminals of a SD card (Panasonic, Toshiba limited, Sun Disk Inc.). On a rear surface-side of the memory card 1 (rear surface of the base substrate 4), nine pieces of external connection terminals 9 in total are arranged. Further, FIG. 55 illustrates a case in which the number of external connection terminals 4 in the memory card 1 of this embodiment 9 is registered with the number of external connection terminals 9 of an IC card. On the rear surface-side of the memory card 1 (rear surface of the base substrate 4), thirteen pieces of external connection terminals 9 in total are arranged, wherein these external connection terminals 9 are arranged in two rows partially. In both cases, this embodiment 9 can cope with the change of the Standard of memory without giving rise to any problem.

EMBODIMENT 10

In this embodiment 10, in a full-size memory card in which the planar dimensions of the base substrate are set approximately one half of the planar dimensions of the cap, still another modification having a structure which can enhance the above-mentioned bending rupture strength is explained.

Figure 56:
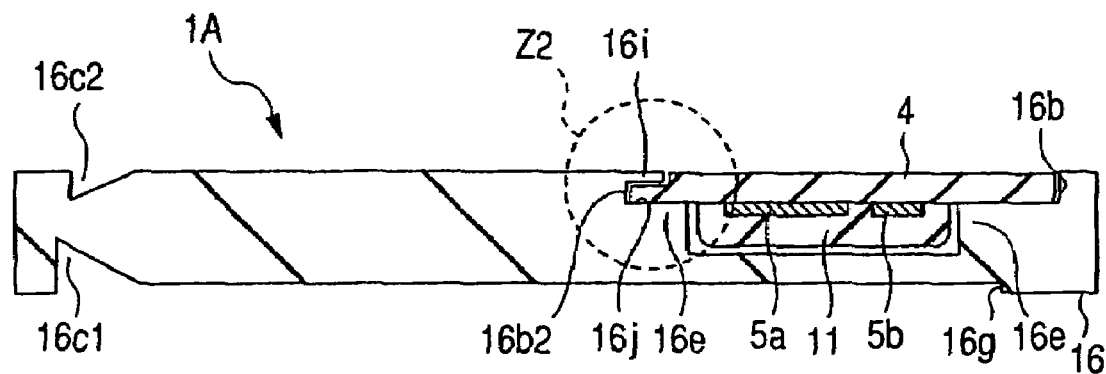
FIG. 56 is a cross-sectional view of a full-size semiconductor device of another embodiment of the present invention.
Figure 57:
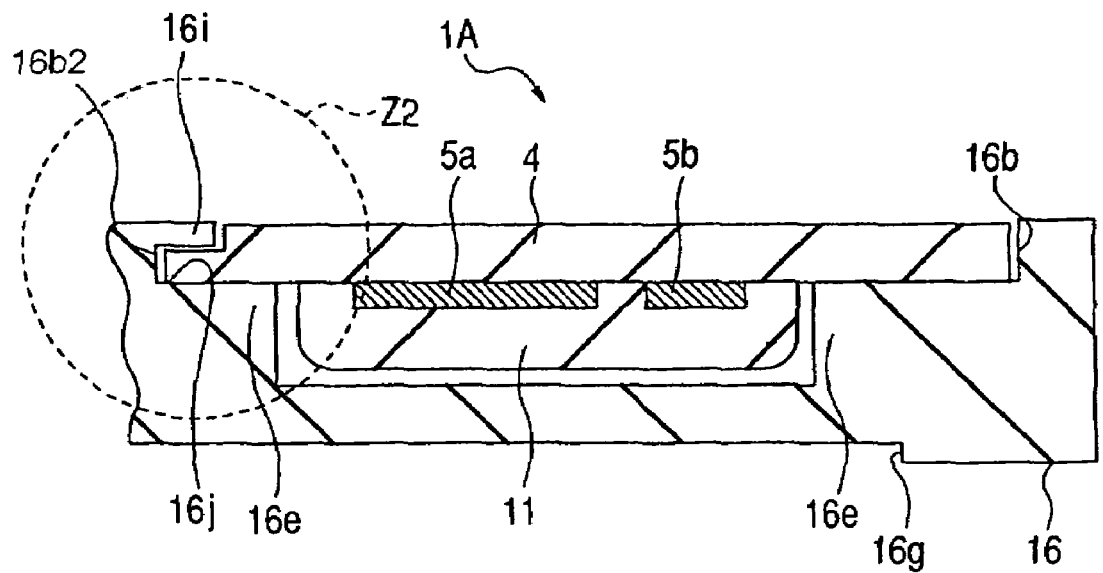
FIG. 57 is an enlarged cross-sectional view of an essential part in FIG. 56.

FIG. 56 is a cross-sectional view of a full-size memory card 1A of this embodiment 10 and FIG. 57 is an enlarged cross-sectional view of an essential part in FIG. 56. In this embodiment 10, an eaves portion 16i is integrally formed on a long side 16b2 of a groove 16b of a cap 16. The eaves portion 16i may be extended along the long side 16b2 or may be scattered at portions of the long side 16b2. In this manner, with a provision of the eaves portion 16i (that is, by providing a reinforcing member), a recessed portion 16j is formed on a side face at the long side 16b2 of the groove 16b. By having a portion of aback-face side of the base substrate 4 fitted into the inside of this recessed portion 16j, this embodiment 10 provides a structure which can firmly fix the base substrate 4. Here, to have the base substrate 4 fitted into the recessed portion 16j, the portion of the back-face side of the base substrate 4 is made thin by half etching. Due to such a structure, it is possible to enhance the above-mentioned bending rupture strength so that the peeling-off of the base substrate 4 and the rupture of the cap 16 can be suppressed or prevented. When the structure of this embodiment 10 is adopted, it may be unnecessary to provide chamfered portions 16b4, 16b5 to the groove 16b. However, it is possible to enhance the bending rupture strength by providing the chamfered portions 16b4, 16b5. Further, in this case, the eaves portions 16i may be formed at the chamfered portions 16b4, 16b5.

Although the invention which has been made by the inventors has been specifically explained based on the embodiments heretofore, it is needless to say that the present invention is not limited to the above-mentioned embodiments and various modifications can be made without departing from the gist of the present invention.

For example, the shape and the number of supporting portions of the adapter are not limited to those of the above-mentioned embodiments and various modifications can be made.

Further, the chips can adopt a connection method which uses bump electrodes besides the connection based on the wire bonding method.

Although the present invention made by the inventors has been explained mainly with respect to the case in which the invention is applied to the memory card incorporating a flash memory (EEPROM) which constitutes the technical field of the background of this invention heretofore, the present invention is not limited to such a memory card and is applicable to a memory card incorporating other memory circuit such as SRAM (Static Random Access Memory), FRAM (Ferroelectric Random Access Memory) or MRAM (Magnetic Random Access Memory). Further, the present invention is also applicable to an IC (Integrated Circuit) card having no memory circuit.

To briefly recapitulate the advantageous effects obtained by one embodiment of the present invention, they are as follows.

That is, by providing the mounting portion having a projecting cross section on which the recessed portion of the metal-made auxiliary piece for increasing the planar dimension of the case body is fitted to the portion of the case body which incorporates the semiconductor chip therein, the versatility of the semiconductor device can be enhanced.

Further, by chamfering corner portions which are positioned at the case body center side with respect to the substrate and the groove of the case body in which the substrate is mounted, the bending rupture strength of the semiconductor device can be enhanced.

INDUSTRIAL APPLICABILITY

The present invention is applicable to the semiconductor device and the manufacturing method thereof.

The invention claimed is:

1. A memory card comprising:
   a substrate having a front surface and a rear surface opposite to said front surface;
   a first flash memory chip mounted over said front surface of said substrate;
   a controller chip for said first flash memory chip mounted over said front surface of said substrate;
   a plurality of external terminals arranged on said rear surface of said substrate;
   a sealing member covering said first flash memory chip and said controller chip; and
   a case body covering said sealing member and said front surface of said substrate;
   wherein first mounting portions being able to connect said case body and an adapter are formed at two corner portions of said case body,
   wherein a second mounting portion being able to connect said case body and an adapter is formed between said two corner portions at a rear surface side of said memory card, and
   wherein said second mounting portion has a first groove and a second groove formed in said first groove, and said first and second grooves are formed for catching a pawl portion of said adapter.

2. A memory card according to claim 1, wherein a thickness of said memory card is greater than a thickness of said first mounting portions.

3. A memory card according to claim 1, wherein a planar area of said first flash memory chip is greater than that of said controller chip.

4. A memory card according to claim 1, further comprising a second flash memory chip.

5. A memory card according to claim 4, wherein said second flash memory chip is staked on said first flash memory chip.

6. A memory card according to claim 1, wherein a planar size of said memory card when said adapter is connected to said case body is the dimensions (32 mm×24 mm).

7. A memory card according to claim 1, wherein a length of a long side of said memory card is set to 24 mm, and wherein a length of a short side of said memory card is set to 18 mm.

8. A memory card according to claim 1, wherein a thickness of said memory card is set to 1.4 mm.

9. A memory card according to claim 1, wherein said external terminals include a CLK terminal, a DAT terminal, and a CMD terminal.

10. A memory card according to claim 9, wherein the number of said external terminals is 7.

11. A memory card according to claim 9, wherein the number of said external terminals is 9.

12. A memory card according to claim 9, wherein the number of said external terminals is 13.

13. A memory card according to claim 12, wherein said external terminals are arranged in two rows.

14. A memory card according to claim 1, wherein said sealing member is formed of resin that is different from resin of which said case body is formed.

15. A memory card according to claim 14, wherein said resin of said case body is ABS resin or PPE (Poly Phenylen Ether).

16. A memory card according to claim 15, wherein said resin of said sealing member is epoxy-based resin.

17. A memory card according to claim 1, wherein, in a direction perpendicular to an insertion direction of said memory card, a width of said second mounting portion is greater than a width of said first mounting portions on a front surface side and said rear surface side of said memory card, respectively.

18. A memory card comprising:
    a substrate having a front surface and a rear surface opposite to said front surface;
    a first flash memory chip mounted over said front surface of said substrate;
    a controller chip for said first flash memory chip mounted over said front surface of said substrate;
    a plurality of external terminals arranged on said rear surface of said substrate;
    a sealing member covering said first flash memory chip and said controller chip; and
    a case body covering said sealing member and said front surface of said substrate;
    wherein first mounting portions being able to connect said case body and an adapter are formed at two corner portions of said case body,
    wherein a second mounting portion being able to connect said case body and an adapter is formed between said two corner portions at a rear surface side of said memory card, and
    wherein a width of said second mounting portion is greater than a width of said first mounting portions on a front surface side of said memory card and said rear surface side, respectively.

19. A memory card according to claim 18, wherein said second mounting portion includes a groove for catching a pawl portion of said adapter.

20. A memory card according to claim 18, wherein a thickness of said memory card is greater than a thickness of said first mounting portions.

21. A memory card according to claim 18, wherein a planar area of said first flash memory chip is larger than that of said controller chip.

22. A memory card according to claim 18, further comprising a second flash memory chip.

23. A memory card according to claim 22, wherein said second flash memory chip is staked on said first flash memory chip.

24. A memory card according to claim 18, wherein a planar size of said memory card when said adapter is connected to said case body is the dimensions (32 mm×24 mm).

25. A memory card according to claim 18, wherein a length of a long side of said memory card is set to 24 mm, and wherein a length of a short side of said memory card is set to 18 mm.

26. A memory card according to claim 18, wherein a thickness of said memory card is set to 1.4 mm.

27. A memory card according to claim 18, wherein said external terminals include a CLK terminal, a DAT terminal, and a CMD terminal.

28. A memory card according to claim 27, wherein the number of said external terminals is 7.

29. A memory card according to claim 27, wherein the number of said external terminals is 9.

30. A memory card according to claim 27, wherein the number of said external terminals is 13.

31. A memory card according to claim 30, wherein said external terminals are arranged in two rows.

32. A memory card according to claim 18, wherein said sealing member is formed of resin that is different from resin of which said case body is formed.

33. A memory card according to claim 32, wherein said resin of said case body is ABS resin or PPE (Poly Phenyl en Ether).

34. A memory card according to claim 33, wherein said resin of said sealing member is epoxy-based resin.

* * * * *